(12) United States Patent
Wang et al.

(10) Patent No.: US 10,424,602 B2
(45) Date of Patent: Sep. 24, 2019

(54) DISPLAY PANEL

(71) Applicant: Au Optronics Corporation, Hsinchu (TW)

(72) Inventors: Cheng-Kuang Wang, Hsinchu County (TW); Chun-Da Tu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 15/976,856

(22) Filed: May 10, 2018

(65) Prior Publication Data
US 2018/0331125 A1 Nov. 15, 2018

(30) Foreign Application Priority Data

May 12, 2017 (TW) .............................. 106115682 A
Jan. 15, 2018 (TW) .............................. 107101351 A

(51) Int. Cl.
*H01L 27/12* (2006.01)
*G09G 3/20* (2006.01)
*G11C 19/28* (2006.01)

(52) U.S. Cl.
CPC ............. *H01L 27/124* (2013.01); *G09G 3/20* (2013.01); *G11C 19/28* (2013.01); *H01L 27/1255* (2013.01); *G09G 3/2092* (2013.01); *G09G 2300/0408* (2013.01); *G09G 2300/0809* (2013.01); *G09G 2310/0286* (2013.01)

(58) Field of Classification Search
CPC ..... H01L 27/124; H01L 27/1255; G09G 3/20; G09G 3/2092; G09G 2300/0408; G09G 2300/0809; G09G 2300/0286; G11C 19/28

USPC .......................................................... 257/71
See application file for complete search history.

(56) References Cited

U.S. PATENT DOCUMENTS

| 5,396,261 | A  | 3/1995 | Hastings, III |
| 8,766,891 | B2 | 7/2014 | Yang et al.   |
| 8,779,436 | B2 | 7/2014 | Chen et al.   |
| 9,123,591 | B2 | 9/2015 | Chen et al.   |
| 9,423,660 | B2 | 8/2016 | Huang et al.  |
| 9,542,903 | B2 | 1/2017 | Chen et al.   |

(Continued)

FOREIGN PATENT DOCUMENTS

| CN | 104536229 | 4/2015 |
| CN | 104849928 | 8/2015 |

(Continued)

OTHER PUBLICATIONS

"Office Action of Taiwan Counterpart Application," dated Apr. 17, 2018, p. 1-p. 5.

*Primary Examiner* — Cuong Q Nguyen
(74) *Attorney, Agent, or Firm* — JCIPRNET

(57) ABSTRACT

A display panel including a display region and a non-display region, a plurality of gate lines, a plurality of data lines, a pixel array and a gate on array circuit. The non-display region is located at one side of the display region. The plurality of gate lines and the plurality of data lines are disposed in the display region. The pixel array is located in the display region, wherein the pixel array is composed of a plurality of pixel units that are repeatedly arranged. The pixel units consist of three gate lines, two data lines and six sub-pixels, and each sub-pixel is electrically connected to one of the gate lines and one of the data lines located in the pixel array respectively. The gate on array circuit is disposed in the pixel array.

18 Claims, 17 Drawing Sheets

(56) References Cited

U.S. PATENT DOCUMENTS

| | | | |
|---|---|---|---|
| 9,653,494 | B2 | 5/2017 | Jin |
| 9,685,131 | B2 | 6/2017 | Tanaka et al. |
| 9,760,102 | B2 | 9/2017 | Tanaka et al. |
| 9,798,339 | B2 | 10/2017 | Tanaka et al. |
| 2009/0121973 | A1 | 5/2009 | Kim et al. |
| 2012/0113016 | A1 | 5/2012 | Lin et al. |
| 2012/0293490 | A1* | 11/2012 | Yang .................. G02F 1/13338 345/419 |
| 2014/0054624 | A1 | 2/2014 | Chen et al. |
| 2014/0264357 | A1 | 9/2014 | Chen et al. |
| 2015/0293546 | A1 | 10/2015 | Tanaka et al. |
| 2015/0325198 | A1 | 11/2015 | Chen et al. |
| 2016/0019856 | A1* | 1/2016 | Tanaka ................. G09G 3/3648 345/206 |
| 2016/0155752 | A1 | 6/2016 | Huang et al. |
| 2016/0307937 | A1 | 10/2016 | Jin |
| 2016/0370635 | A1 | 12/2016 | Tanaka et al. |
| 2018/0011504 | A1 | 1/2018 | Tanaka et al. |
| 2018/0122288 | A1 | 5/2018 | Huang et al. |

FOREIGN PATENT DOCUMENTS

| | | |
|---|---|---|
| CN | 105164743 | 12/2015 |
| CN | 106782416 | 5/2017 |
| CN | 104756177 | 10/2017 |
| TW | 201248200 | 12/2012 |
| TW | 201409139 | 3/2014 |
| TW | I434203 | 4/2014 |
| TW | I489185 | 6/2015 |
| TW | I518426 | 1/2016 |

* cited by examiner

DISPLAY PANEL

CROSS-REFERENCE TO RELATED APPLICATION

This application claims the priority benefits of Taiwan application serial no. 106115682, filed on May 12, 2017, and Taiwan application serial no. 107101351, filed on Jan. 15, 2018. The entirety of each of the above-mentioned patent applications is hereby incorporated by reference herein and made a part of specification.

BACKGROUND

Field of the Disclosure

The disclosure is related to a display panel, and particularly to a display panel in which a gate driver circuit is disposed in pixel array.

Description of Related Art

Gate on Array (GOA) circuit substrate technique refers to a technique through which a gate driver circuit is directly fabricated on an active element array substrate in design of panel to replace external driving chip. Typically, the gate driver circuit is disposed in the peripheral region nearby the display region of panel. However, conventionally the gate driver circuit occupies a large portion of the border area. If the gate driver circuit is moved into the display region, the border area can be significantly reduced and the display area can be increased. In ten is of known technologies, there is no successful attempt in disposing the gate driver circuit in the display region yet. In light of the above, it is necessary to make improvement to current gate on array circuit substrate technique.

SUMMARY OF THE DISCLOSURE

According to the disclosure, a display panel includes a display region and a non-display region, a plurality of gate lines, a plurality of data lines, a pixel array and a gate driver circuit. The non-display region is located at one side of the display region. The plurality of gate lines and the plurality of data lines are disposed in the display region. The pixel array is disposed in the display region, and the pixel array has a plurality of pixel units. The pixel units consist of three gate lines, two data lines and six sub-pixels, and each of the sub-pixels is electrically connected one of the gate lines and one of the data lines respectively. The gate driver circuit is electrically connected to the plurality of the gate lines and disposed in the pixel array.

According to the disclosure, a display panel includes a pixel array and a gate driver circuit. The pixel array has a plurality of pixel units. The pixel array comprises a plurality of gate lines, a plurality of data lines and a plurality of sub-pixels. The plurality of sub-pixels are electrically connected to one of the gate lines and one of the data lines respectively. Each of the pixel units includes two gate lines, three data lines and six sub-pixels. The gate driver circuit is disposed in the pixel array.

According to at least one embodiment of the disclosure, each of the pixel units of the display panel includes three gate lines, two data lines and six sub-pixels. In this manner, there is extra space for the gate driver circuit to be disposed in the pixel array of the display region. Accordingly, when the gate driver circuit is moved into the display region, it is possible to achieve the technical effect of reducing cost, significantly decreasing the frame and increasing the area of display region.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF EMBODIMENTS

Figure 1:
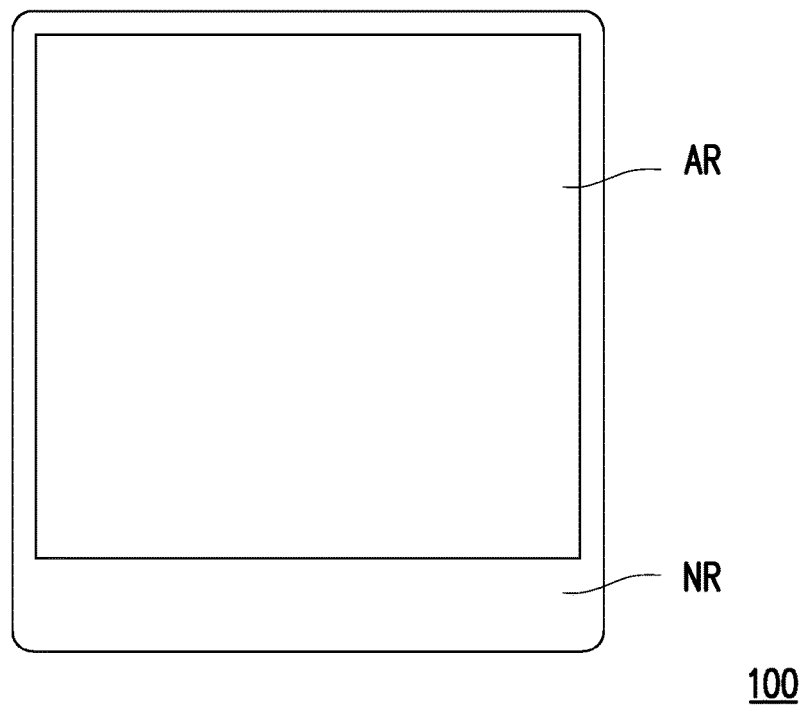
FIG. 1 is a top view of a display panel according to an embodiment of the disclosure.

In the drawings, in order show the illustrations clearly, the thickness of layers, films, panels and regions are exaggerated. Throughout the specification, the same reference numeral denotes the same element. It should be understood that when it is described that an element on the layer, film, region or substrate is "on" another element or "connected to" another element, it can be either directly on another element or connected to another element; alternatively, an intervening element may be present. On the contrary, when it is described that an element is "directly on another element" or "directly connected to" another element, no intervening element is present there. As described in the present text, "connected to" or "coupled to" may refer to physical and/or electrical connection. Alternatively, "electrically connected" or "coupled to" may refer to that there is another element existed between two elements.

Unless defined otherwise, all technical and scientific terms used herein have the same meaning as commonly understood by one of ordinary skill in the art to which this disclosure belongs. It is noted that the use of any and all examples, or exemplary terms provided herein is intended merely to better illuminate the disclosure and is not a limitation on the scope of the disclosure unless otherwise specified. Further, unless defined otherwise, all terms defined in generally used dictionaries may not be overly interpreted.

The terminology used herein is for the purpose of describing particular embodiments and is not intended to be limiting of the disclosure. As used herein, the singular forms "a," "an" and "the" are intended to include the plural forms as well, including "at least one", unless the context clearly indicates otherwise.

The exemplary embodiment is described below with reference of a cross-sectional view of a schematic diagram of an idealized embodiment. Therefore, a shape change of the figure serving as a result of manufacturing techniques and/or tolerances may be expected. Therefore, the embodiment of the disclosure should not be construed as limited to a particular shape of a region as shown herein, but includes a shape deviation caused by manufacturing tolerance. For example, a shown or described flat area may generally have rough and/or non-linear features. Moreover, a shown acute angle may be round. Therefore, a region shown in the figure is essentially schematic, and a shape thereof is not intended to show an accurate shape of the region, and is not intended to limit a range of the claims of the disclosure.

FIG. 1 is a top view of a display panel according to an embodiment of the disclosure. Referring to FIG. 1, a display panel 100 in the embodiment of the disclosure includes a display region AR and a non-display region NR, wherein the non-display region NR is disposed at one side of the display region AR, or the non-display region NR surrounds the display region AR. In other words, the non-display region NR is disposed at one lateral side of the display region AR but it is adjusted depending on different needs. Take that the non-display region NR surrounds the display region AR for example: when being applied to rectangular display region, the non-display region NR is located at one lateral side, two lateral sides, three lateral sides or four lateral sides of the display region AR; when being applied to non-rectangular display region or circular display region, the non-display region NR is located in adjacency to the display region AR, which forms that the non-display region NR is located on a partial periphery or the overall periphery of the display region AR. Generally speaking, the gate driver circuit is typically fabricated in the non-display region of the panel, border area. However, in the embodiment of the disclosure, the gate driver circuit is disposed in the display region AR. The following embodiment describes how the gate driver circuit is disposed in the display region AR.

For instance, the display panel 100 in the embodiment includes a pixel array disposed in the display region AR. The pixel array is arranged in three different aspects as illustrated in FIG. 2A to FIG. 2C, for example.

Figure 2A:
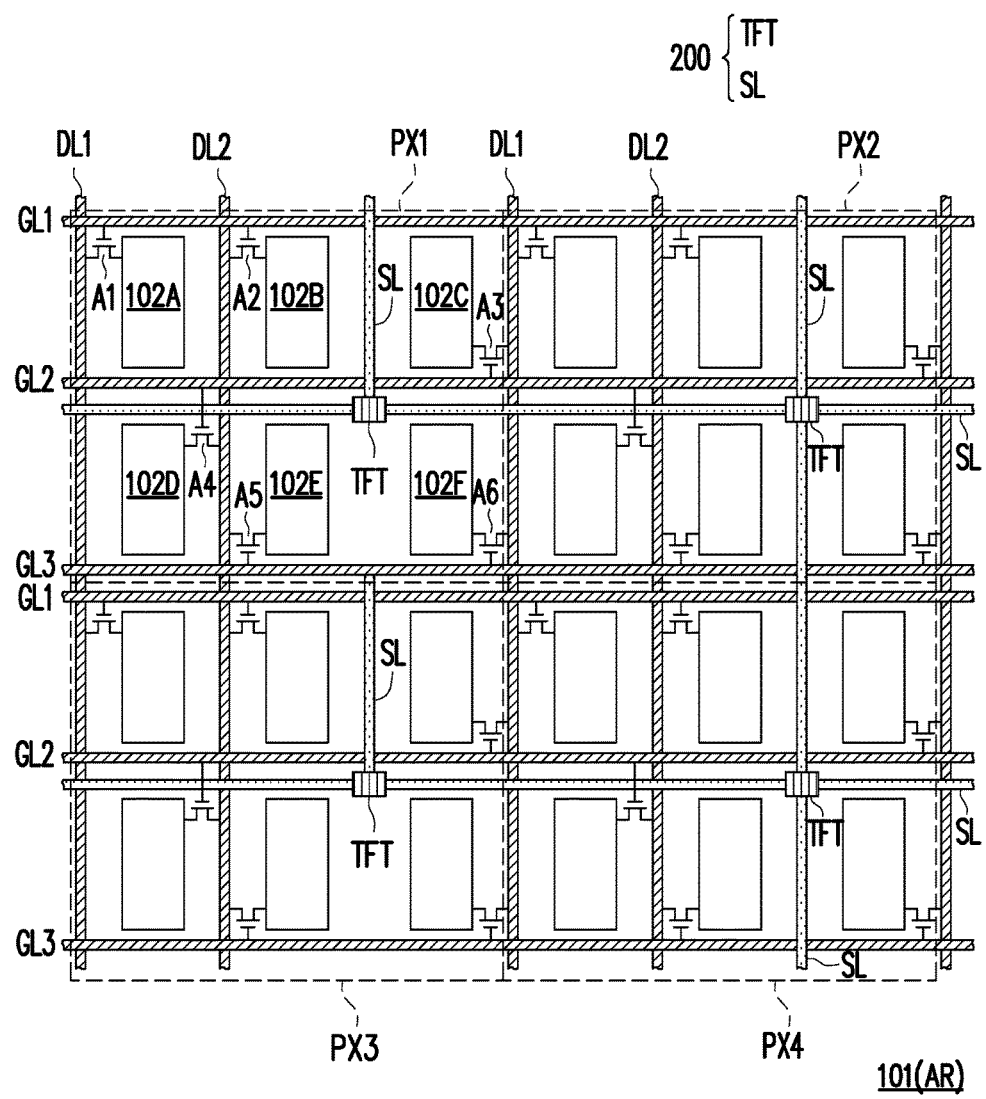
FIG. 2A is a schematic view showing arrangement of a pixel array according to an embodiment of the disclosure.
Figure 2B:
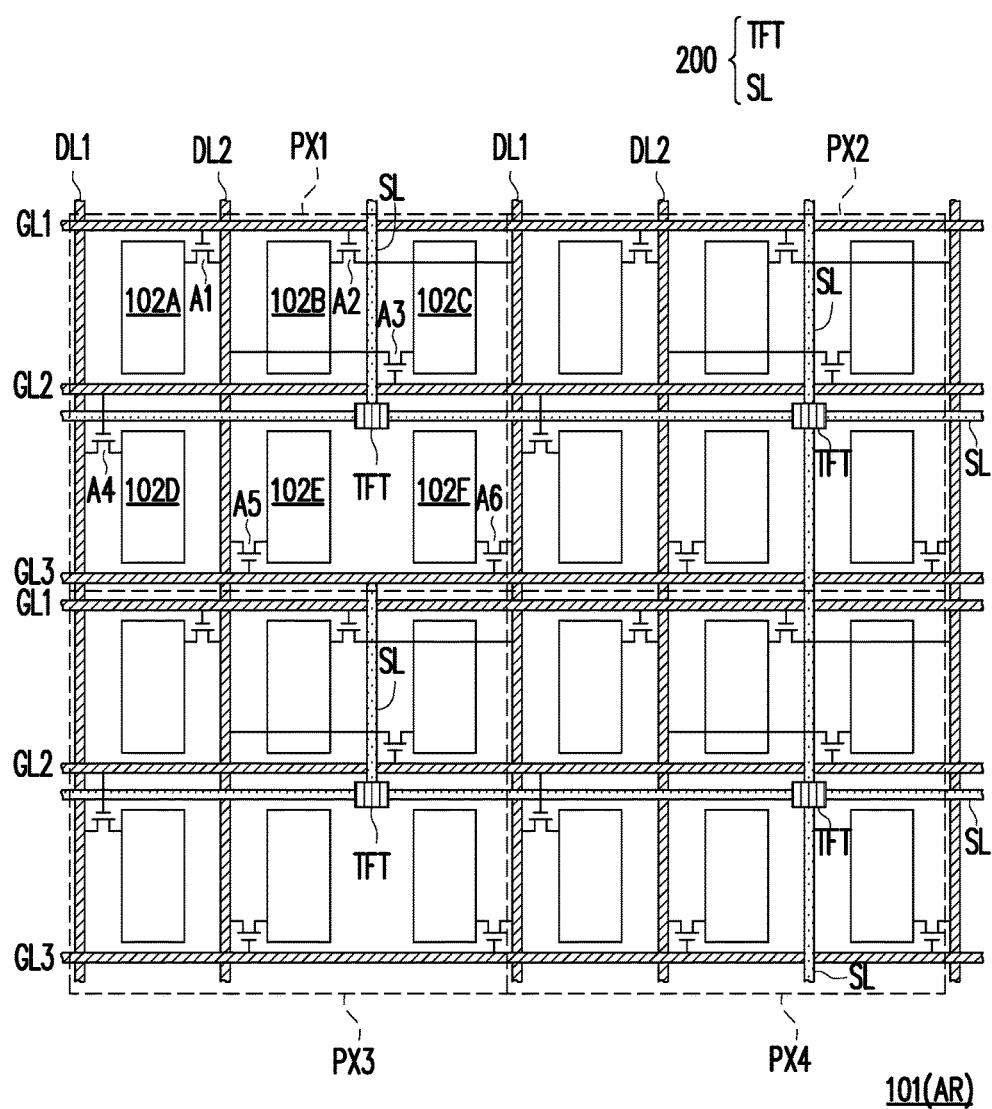
FIG. 2B is a schematic view showing arrangement of a pixel array according to another embodiment of the disclosure.
Figure 2C:
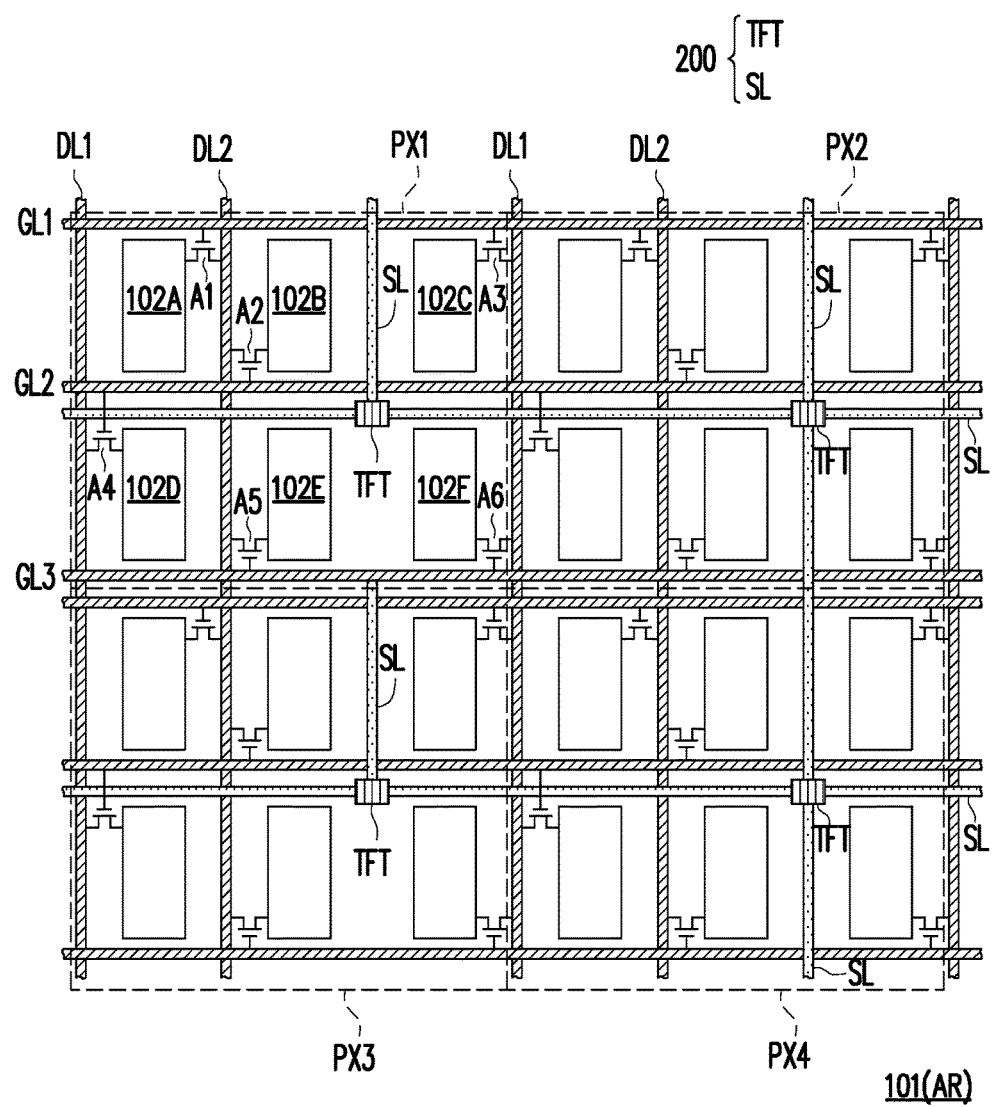
FIG. 2C is a schematic view showing arrangement of a pixel array according to yet another embodiment of the disclosure.

FIG. 2A is a schematic view showing arrangement of a pixel array according to an embodiment of the disclosure. As shown in FIG. 2A, a pixel array 101 is disposed in the display region AR of FIG. 1, and the pixel array 101 is composed of a plurality of pixel units (PX1, PX2, PX3, PX4) arranged repeatedly. FIG. 2A is exemplified with four groups of pixel units, namely pixel unit PX1, pixel unit PX2, pixel unit PX3 and pixel unit PX4 arranged repeatedly. However, it should be indicated that the display panel 100 actually includes more pixel units arranged repeatedly. The pixel unit PX2, the pixel unit PX 3 and the pixel unit PX4 are configured in the same manner as the pixel unit PX1. Therefore, only the pixel unit PX1 is described for exemplary purpose.

Referring to the embodiment of FIG. 2A, the pixel array 101 includes a plurality of gate lines (GL1, GL2, GL3 . . . ) disposed in the display region AR and a plurality of data lines (DL1, DL2 . . . ) disposed in the display region AR. Each of the pixel units (PX1, PX2, PX3, PX4) includes three gate lines (GL1, GL2, GL3), two data lines (DL1, DL2) and six sub-pixels (102A, 102B, 102C, 102D, 102E, 102F) and each of the sub-pixels is electrically connected to one of the gate lines and one of the data lines in the pixel array 101 respectively. In the embodiment, the gate lines (GL1, GL2, GL3 . . . ) and the data lines (DL1, DL2 . . . ) are arranged in an interlacing manner, and an insulating layer is sandwiched between the gate lines (GL1, GL2, GL3 . . . ) and the data lines (DL1, DL2 . . . ). In other words, the extending direction of the gate lines (GL1, GL2, GL3 . . . ) and the extending direction of the data lines (DL1, DL2 . . . ) are not parallel with each other. In the embodiment of FIG. 2A, the extending direction of the gate lines (GL1, GL2, GL3 . . . ) is substantially perpendicular to the extending direction of the data lines (DL1, DL2 . . . ), which should not be construed as a limitation to the disclosure. For the purpose of conductivity, the gate lines (GL1, GL2, GL3 . . . ) and the data lines (DL1, DL2 . . . ) are formed of metal material in most cases, but the disclosure provides no limitation thereto. According to other embodiments, the gate lines (GL1, GL2, GL3 . . . ) and the data lines (DL1, DL2 . . . ) are formed of other conductive material such as alloy, nitride of metal material, oxide of metal material, oxynitride of metal material or other suitable material, or a stacked layer of metal material and other conductive material.

Specifically, as shown in FIG. 2A, the three gate lines of the pixel unit PX1 include a first gate line GL1, a second gate line GL2 and a third gate line GL3. The two data lines of the pixel unit PX1 include a first data line DL1 and a second data line DL2. The six sub-pixels of the pixel unit PX1 include a first sub-pixel 102A, a second sub-pixel 102B, a third sub-pixel 102C, a fourth sub-pixel 102D, a fifth sub-pixel 102E and a sixth sub-pixel 102F. In the pixel unit PX1, the first sub-pixel 102A is electrically connected to the first gate line GL1 and the first data line DL1 respectively through a switch element A1, the second sub-pixel 102B is electrically connected to the first gate line GL1 and the second data line DL2 respectively through a switch element A2, the third sub-pixel 102C is electrically connected to the second gate line GL2 and the first data line DL1 of another pixel unit PX2 adjacent to the pixel unit PX1 respectively through a switch element A3. In the embodiment, the pixel unit that is "adjacent to" the pixel unit PX1 refers to another pixel unit that is the closest to the pixel unit PX1, and for example, refers to the next pixel unit arranged continuously along the extending direction of the gate line.

Additionally, in FIG. 2A, the fourth sub-pixel 102D is electrically connected to the second gate line GL2 and the second data line DL2 respectively through a switch element A4, the fifth sub-pixel 102E is electrically connected to the third gate line GL3 and the second data line DL2 respectively through a switch element A5, the sixth sub-pixel 102F is electrically connected to the third gate line GL3 and the first data line DL1 of another pixel unit PX2 respectively through a switch element A6. In the embodiment, the first sub-pixel 102A, the second sub-pixel 102B and the third sub-pixel 102C are disposed between the first gate line GL1 and the second gate line GL2, and the fourth sub-pixel 102D, the fifth sub-pixel 102E, and the sixth sub-pixel 102F are disposed between the second gate line GL2 and the third gate line GL3.

Referring to FIG. 2A, the gate driver circuit is disposed in the pixel array 101 of the display region AR, and the gate driver circuit includes a plurality of driving units 200, and each of the plurality of driving units 200 includes a plurality of active elements TFT and a plurality of signal lines SL. In the embodiment of FIG. 2A, since each of the pixel units (PX1, PX2, PX3, PX4) is only provided with two data lines (DL1, DL2), and the third data line is omitted. In comparison of the conventional display panel includes three data lines in the pixel unit, in this manner, there are more space available, so that the driving unit 200 can be correspondingly disposed between the region formed by adjacent sub-pixels or pixel units. More specifically, the driving units 200 are disposed in a space between the second sub-pixel 102B and the third sub-pixel 102C, and disposed in a space between the fifth sub-pixel 102E and the sixth sub-pixel 102F. Furthermore, one of the signal lines SL of the driving unit 200 is disposed between the second sub-pixel 102B and the third sub-pixel 102C of the pixel unit PX1, and one of the signal lines SL is substantially parallel with the data lines (DL1, DL2). In the embodiment of FIG. 2A, each of the sub-pixels is arranged in rectangular shape and the data lines (DL1, DL2) are substantially perpendicular to the gate line (GL1, GL2, GL3). In this manner, the signal line SL is substantially parallel with the data lines (DL1, DL2), which should not be construed as a limitation to the disclosure. In other embodiments, the sub-pixels are arranged in non-rectangular shape. Therefore, the signal line SL is not completely parallel with the data lines (DL1, DL2). With the configuration shown in FIG. 2A, it is possible to effectively dispose the gate driver circuit in the pixel array 101 of the display region AR, thereby achieving the technical effect of reducing cost, significantly decreasing border area and increasing the area of display region.

FIG. 2B is a schematic view showing arrangement of a pixel array according to another embodiment of the disclosure. FIG. 2B is similar to the pixel array 101 in FIG. 2A, therefore, the same elements are represented by the same numerals and no repetition is incorporated herein. The difference between the embodiments of FIG. 2B and FIG. 2A is that each of the sub-pixels is connected in different manners. As shown in FIG. 2B, in the pixel unit PX1, the first sub-pixel 102A is electrically connected to the first gate line GL1 and the second data line DL2 respectively through the switch element A1, the second sub-pixel 102B is electrically connected to the first gate line GL1 and the first data line DL1 of another pixel unit PX2 adjacent to the pixel unit PX1 respectively through the switch element A2. In the embodiment, the pixel unit that is "adjacent to" the pixel unit PX1 refers to another pixel unit that is the closest to the pixel unit PX1, and for example, refers to the next pixel unit arranged continuously along the extending direction of the gate line.

Additionally, in FIG. 2B, the third sub-pixel 102C is electrically connected to the second gate line GL2 and the second data line DL2 respectively through the switch element A3, the fourth sub-pixel 102D is electrically connected to the second gate line GL2 and the first data line DL1 respectively through the switch element A4, the fifth sub-pixel 102E is electrically connected to the third gate line GL3 and the second data line DL2 respectively through the switch element A5, the sixth sub-pixel 102F is electrically connected to the third gate line GL3 and the first data line DL1 of another pixel unit PX2 respectively through the switch element A6. In the embodiment, the first sub-pixel 102A, the second sub-pixel 102B and the third sub-pixel 102C are disposed between the first gate line GL1 and the second gate line GL2, and the fourth sub-pixel 102D, the fifth sub-pixel 102E and the sixth sub-pixel 102F are disposed between the second gate line GL2 and the third gate line GL3. The pixel unit PX2, the pixel unit PX3 and the pixel unit PX4 are disposed in the same manner as the pixel unit PX1; therefore, no repetition is incorporated herein and labeling is omitted.

Likewise, in the embodiment of FIG. 2B, the gate driver circuit is disposed in the pixel array 101 of the display region AR. Since each of the pixel units (PX1, PX2, PX3, PX4) is only provided with two data lines (DL1, DL2), and the third data line is omitted. In comparison with the conventional display panel includes three data lines and three gate lines in the pixel unit, there are more available space between the region formed by adjacent sub-pixels or pixel units (102B and 102C; 102E and 102F) in the embodiment, so that the driving units 200 can be correspondingly disposed between the region formed by adjacent sub-pixels or pixel units (102B and 102C; 102E and 102F). With the configuration shown in FIG. 2B, it is possible to effectively dispose the gate driver circuit in the pixel array 101 of the display region AR, thereby achieving the technical effect of reducing cost, significantly decreasing border area and increasing the area of display region.

FIG. 2C is a schematic view showing arrangement of a pixel array according to yet another embodiment of the disclosure. FIG. 2C is similar to the pixel array 101 in FIG. 2A; therefore, the same elements are represented by the same numerals and no repetition is incorporated herein. The difference between the embodiments of FIG. 2C and FIG. 2A is that each of the sub-pixels is connected in different manners. As shown in FIG. 2C, in the pixel unit PX1, the first sub-pixel 102A is electrically connected to the first gate line GL1 and the second data line DL2 receptively through the switch element A1, the second sub-pixel 102B is electrically connected to the second gate line GL2 and the second data line DL2 respectively through the switch element A2, the third sub-pixel 102C is electrically connected to the first gate line GL1 and the first data line DL1 of another pixel unit PX2 adjacent to the pixel unit PX1 respectively through the switch element A3. In the embodiment, the pixel unit that is "adjacent to" the pixel unit PX1 refers to another pixel unit that is the closest to the pixel unit PX1, and for example, refers to the next pixel unit that is arranged continuously along the extending direction of the gate line.

Additionally, in FIG. 2C, the fourth sub-pixel 102D is electrically connected to the second gate line GL2 and the first data line DL1 respectively through the switch element A4, the fifth sub-pixel 102E is electrically connected to the third gate line GL3 and the second data line DL2 respectively through the switch element A5, the sixth sub-pixel 102F is electrically connected to the third gate line GL3 and the first data line DL1 of another pixel unit PX2 respectively through the switch element A6. In the embodiment, the first sub-pixel 102A, the second sub-pixel 102B and the third sub-pixel 102C are disposed between the first gate line GL1 and the second gate line GL2, and the fourth sub-pixel 102D, the fifth sub-pixel 102E and the sixth sub-pixel 102F are disposed between the second gate line GL2 and the third gate line GL3. The pixel unit PX2, the pixel unit PX3 and the pixel unit PX4 are disposed in the same manner as the pixel unit PX1; therefore, no repetition is incorporated herein and labeling is omitted.

Likewise, in the embodiment of FIG. 2C, the gate driver circuit is disposed in the pixel array 101 of the display region AR. Since each of the pixel units (PX1, PX2, PX3, PX4) is only provided with two data lines (DL1, DL2), and the third data line is omitted. In comparison with the conventional display panel, there are more available space between the region formed by adjacent sub-pixels or pixel units (102B and 102C; 102E and 102F) in the embodiment, so that the driving units 200 can be correspondingly disposed between the region formed by adjacent pixel units (102B and 102C; 102E and 102F). With the configuration shown in FIG. 2C, it is possible to effectively dispose the gate driver circuit in the pixel array 101 of the display region AR, thereby achieving the technical effect of reducing cost, significantly decreasing border area and increasing the area of display region.

In the embodiments of FIG. 2A to FIG. 2C, it is only exemplified that the gate driver circuit includes the plurality of driving units 200, and each of the driving units 200 includes the plurality of active elements TFT and the plurality of signal lines SL, but the connection/configuration method of the active elements TFT and the signal lines SL are not described in details. The following embodiment describes different aspects of realization of the driving units 200.

Figure 3:
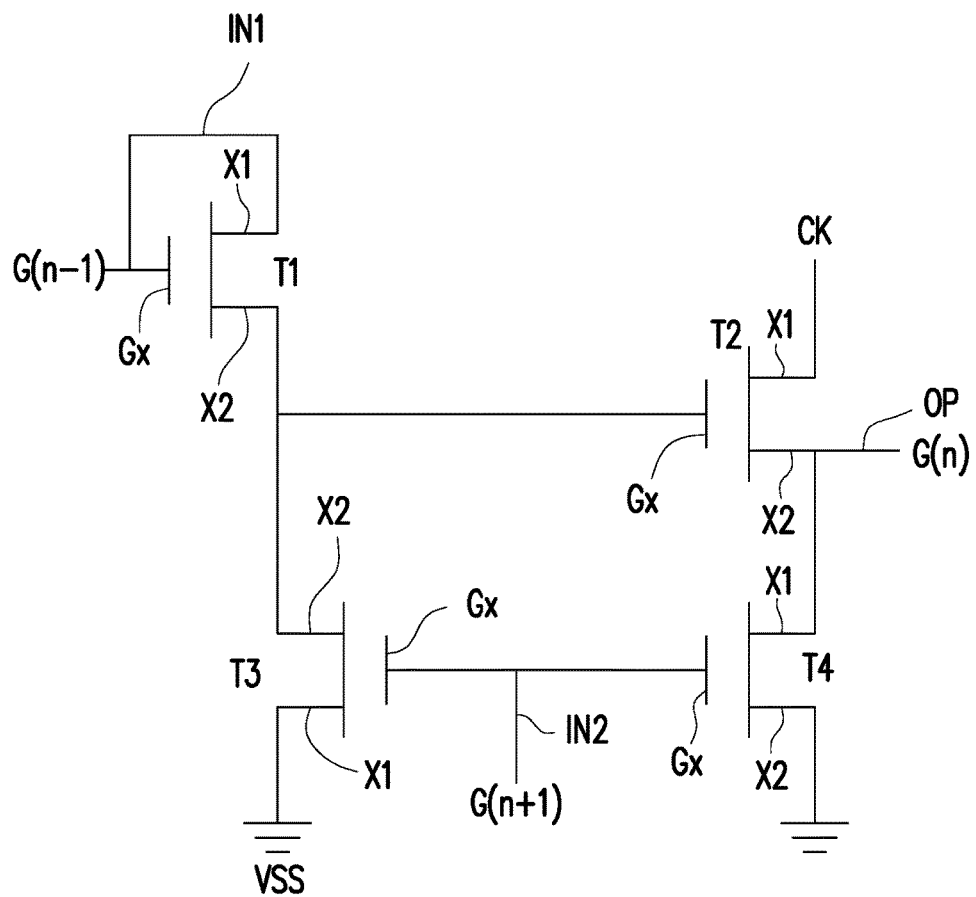
FIG. 3 is a circuit diagram of a driving unit according to an embodiment of the disclosure.

FIG. 3 is a circuit diagram of a driving unit according to an embodiment of the disclosure. In the embodiment, the gate driver circuit in the pixel array 101 in FIG. 2A to FIG. 2C is composed of the plurality of driving units 200 shown in FIG. 3. Specifically, the gate driver circuit is formed as multi-stage driving unit with a plurality of driving units 200 connected in series, and each stage of driving units outputs to the corresponding gate line. For example, a first-stage driving unit outputs to a first gate line, a second-stage driving unit outputs to a second gate line, forming relative relationship in order. That is, the output of the first-stage driving unit electrically connects with the first gate line, and the output of the second-stage driving unit electrically connects with the second gate line. For ease of describing, N-stage is used in the following paragraphs for description; that is, the N-stage driving unit outputs to the Nth gate line, that is, the output of the N-stage driving unit electrically connects with the Nth gate line, wherein N is a positive integer. In the embodiment, the signal lines SL in FIG. 2A to FIG. 2C, for example, include a power signal line VSS, a clock signal line CK, a pre-stage input line IN1, a post-stage input line IN2 and an output line OP. Referring to FIG. 3, the driving unit 200 includes four active elements (T1-T4). More specifically, a first active element T1 has a control end Gx, a first end X1 and a second end X2, wherein the control end Gx and the first end point X1 are connected to the pre-stage input line IN1. The second active element T2 has the control end Gx, the first end X1 and the second end X2, and the control end Gx is electrically connected to the second end X2 of the first active element T1, the first end X1 is electrically connected to the clock signal line CK, and the second end X2 is electrically connected to the output line OP. The third active element T3 has the control end Gx, the first end X1 and the second end X2, the first end X1 is electrically connected to the power signal line VSS, the second end X2 is electrically connected to the second end X2 of the first active element T1, and the control end Gx is electrically connected to the post-stage input line IN2. Additionally, the fourth active element T4 has the control end Gx, the first end X1 and the second end X2, the control end Gx is electrically connected to the post-stage input line IN2, the first end X1 is electrically connected to the output line OP, and the second end X2 is connected to the power signal line VSS.

As shown in FIG. 3, when the pre-stage input line IN1 is electrically connected to the (N−1)th gate line G(n−1), the output line OP is electrically connected to the Nth gate line G(n), and the post-stage input line IN2 is electrically connected to the (N+1)th gate line G(n+1), wherein N is an integer larger than 1. For example, if the pre-stage input line IN1 is electrically connected the first gate line, the output line OP is electrically connected to the second gate line, and the post-stage input line IN2 is electrically connected to the third gate line. Based on the electrical connection method shown in FIG. 3, the driving unit 200 is disposed in the pixel array 101 in two manners as shown in FIG. 4A and FIG. 4B.

Figure 4A:
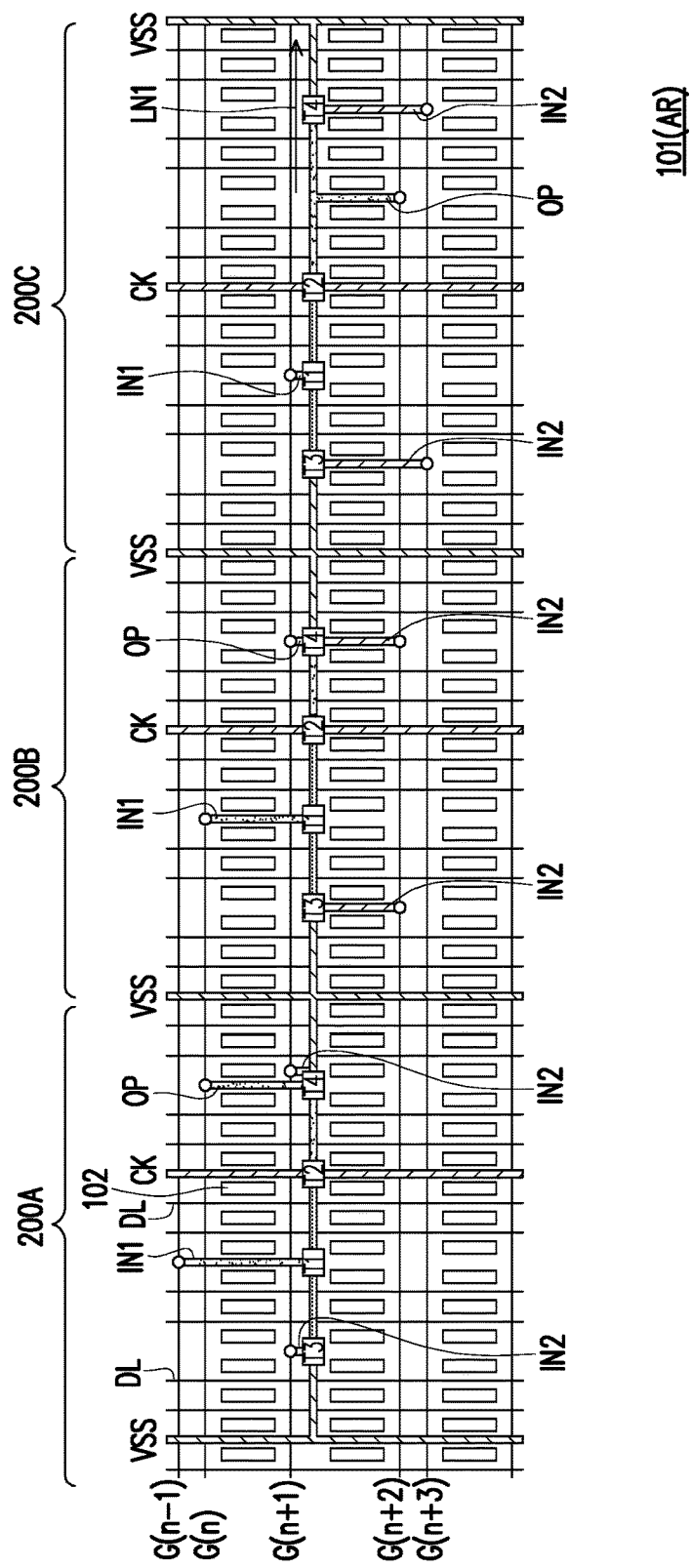
FIG. 4A is a schematic view showing a configuration method of a driving unit according the embodiment of FIG. 3.
Figure 4B:
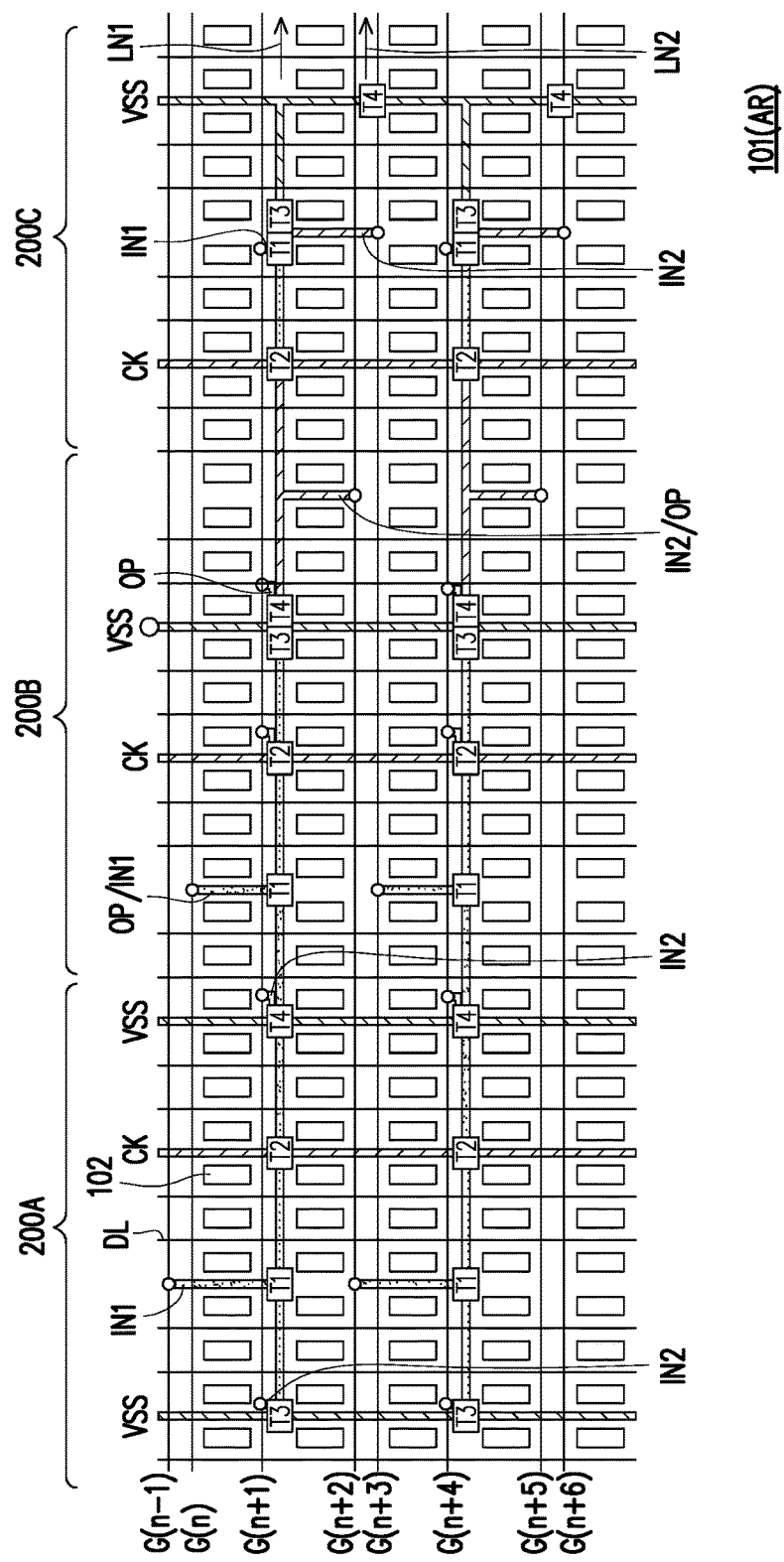
FIG. 4B is a schematic view showing another configuration method of a driving unit according to the embodiment of FIG. 3.

FIG. 4A is a schematic view showing a configuration method of a driving unit according the embodiment of FIG. 3. In the embodiment of FIG. 4A, the plurality of driving units 200 are composed of a first driving unit 200A, a second driving unit 200B and a third driving unit 200C arranged repeatedly. In other words, the gate driver circuit has a plurality of first driving units 200A, the second driving units 200B and the third driving units 200C arranged in order repeatedly. As shown in FIG. 4A, the pre-stage input line IN1, the post-stage input line IN2 and the output line OP of each of the driving units (200A, 200B, 200C) are respectively connected three of the gate lines in the display region AR, and at least one of the sub-pixels 102 is disposed between the clock signal line CK and one of the data lines DL. Additionally, the connection method of each of the driving units (200A, 200B, 200C) is configured in the manner as shown in the embodiment of FIG. 3.

Specifically, in the embodiment of FIG. 4A, the gate line includes (N−1)th gate line G(n−1), Nth gate line G(n), (N+1)th gate line G(n+1), (N+2)th gate line G(n+2) and (N+3)th gate line G(n+3), wherein N is an integer larger than 1. As shown in FIG. 4A, in the first driving unit 200A, the pre-stage input line IN1 is connected to the (N−1)th gate line G(n−1), the post-stage input line IN2 is connected to (N+1) th gate line G(n+1), and the output line OP is connected to the Nth gate line G(n). In the second driving unit 200B, the pre-stage input line IN1 is connected to the Nth gate line G(n), the post-stage input line IN2 is connected to the (N+2)th gate line G(n+2), and the output line OP is connected to the (N+1)th gate line G(n+1). Additionally, in the third driving unit 200C, the pre-stage input line IN1 is connected to the (N+1)th gate line G(n+1), the post-stage input line IN2 is connected to the (N+3)th gate line G(n+3), and the output line OP is connected to the (N+2)th gate line G(n+2).

Additionally, referring to FIG. 4A, the first active element T1, the second active element T2, the third active element T3 and the fourth active element T4 in the first driving unit 200A, the second driving unit 200B and the third driving unit 200C are respectively disposed on the same horizontal line LN1 along the extending direction of the gate lines (G(n−1), G(n), G(n+1) . . . ). In the embodiment, the configuration on the "same horizontal line" refers to that the first active element T1, the second active element T2, the third active element T3 and the fourth active element T4 of all the driving units are disposed in a space between two adjacent rows of sub-pixels 102 at both sides of the extending direction of one of the gate lines. Take the (N+1)th gate line G(n+1) in FIG. 4A as an example, the horizontal line LN1 is located in a space between two rows of sub-pixels 102 at both sides of the (N+1)th gate line G(n+1), and the space thereof is extended along the extending direction of the (N+1)th gate line G(n+1). In this manner, in the embodiment, the first active element T1, the second active element T2, the third active element T3, and the fourth active element T4 of the driving units are disposed in the same space. In particular, in FIG. 4A, the four active elements (T1-T4) in the first driving unit 200A, the second driving unit 200B and the third driving unit 200C on the horizontal line LN1 are respectively arranged in a regular order, and the arranging order is the third active element T3, the first active element T1, the second active element T2 and the fourth active element T4. In the embodiment of the disclosure, "regular arranging order" refers to that, in each of the driving units (200A, 200B, 200C), all of the active elements are arranged in the order of the third active element T3, the first active element T1, the second active element T2 and the fourth active element T4 from left to right. In this manner, with the configuration shown in FIG. 4A, it is possible to effectively dispose the driving units 200 including four active elements in the pixel array 101 of the display region AR.

FIG. 4B is a schematic view showing another configuration method of a driving unit according to the embodiment of FIG. 3. In the embodiments of FIG. 4B and FIG. 4A, the plurality of the driving units 200 are also composed of the first driving unit 200A, the second driving unit 200B and the third driving unit 200C arranged repeatedly. The difference between FIG. 4B and FIG. 4A lies in the layout of signal lines and configuration method of active elements. However, in FIG. 4B, the connection method of the driving units (200A, 200B, 200C) still corresponds to the embodiment of FIG. 3.

As shown in FIG. 4B, the second active element T2 and the fourth active element T4 of the first driving unit 200A are connected to the Nth gate line G(n) through the first active element T1 of the second driving unit 200B. In other words, the output line OP of the first driving unit 200A and the pre-stage input line IN1 of the second driving unit 200B are arranged in the same layout. Additionally, the third active element T3 and the fourth active element T4 of the second driving unit 200B as well as the second active element T2 of the third driving unit 200C are mutually connected to the (N+2)th gate line G(n+2) through the same layout. In other words, the post-stage input line IN2 of the second driving unit 200B and the output line OP of the third driving unit 200C are arranged in the same layout. With the layout shown in FIG. 4B, the third active element T3 and the fourth active element T4 of the second driving unit 200B are combined with each other, and the first active element T1 and the third active element T3 of the third driving unit 200C are combined with each other. In this manner, it is possible to save more space for configuration of layout and thus achieving a better panel design.

Additionally, further referring to FIG. 4B, in the embodiment, the first active element T1, the second active element T2, the third active element T3 and the fourth active element T4 of the first driving unit 200A and the second driving unit 200B are respectively disposed on the same horizontal line LN1 along the extending direction of the gate lines (G(n−1)), G(n+1), G(n+3) . . . ), and the fourth active element T4 of the third driving unit 200C is disposed on a different horizontal line relative to the first active element T1, the second active element T2 and the third active element T3 of the third driving unit 200C. Specifically, in the third driving unit 200C, the first active element T1, the second active element T2 and the third active element T3 are still disposed on the horizontal line LN1, and the fourth active element T4 of the third driving unit 200C is disposed on a horizontal line LN2.

More specifically, in the embodiment of FIG. 4B, the first active element T1, the second active element T2, the third active element T3 and the fourth active element T4 of the first driving unit 200A and the second driving unit 200B are disposed between the (N+1)th gate line G(n+1) and the (N+2)th gate line G(n+2) such that the active elements are disposed on the same horizontal line LN1. Additionally, the first active element T1, the second active element T2 and the third active element T3 in the third driving unit 200C are also disposed between the (N+1)th gate line G(n+1) and the (N+2)th gate line G(n+2) to be located on the same horizontal line LN1. The fourth active element T4 of the third driving unit 200C is disposed between the (N+2)th gate line G(n+2) and the (N+3)th gate line G(n+3) to be located on the horizontal line LN2. In the embodiment of FIG. 4B, the horizontal line LN1 is disposed in a space between two rows of sub-pixels 102 at both sides of the (N+1)th gate line G(n+1), and the space thereof is extended along the extending direction of the (N+1)th gate line G(n+1); and the horizontal line LN2 is located in the space between the two rows of sub-pixels 102 at both sides of the (N+2)th gate line G(n+2), and the space thereof is extended along the extending direction of the (N+2)th gate line G(n+2).

Furthermore, in the embodiment, the four active elements (T1, T2, T3, T4) in the first driving unit 200A, the second driving unit 200B and the third driving unit 200C disposed along the extending direction of the gate lines (G(n−1), G(n), G(n+1) . . . ) are respectively arranged in an irregular order. In other words, in each of the driving units (200A, 200B, 200C), all of the active elements are arranged from left to right in different orders. More specifically, the active elements of the first driving unit 200A are arranged from left to right in the order of the third active element T3, the first active element T1, the second active element T2 and the fourth active element T4. The active elements of the second driving unit 200B arranged from left to right in the order of the first active element T1, the second active element T2, the third active element T3 and the fourth active element T4. The active elements of the third driving unit 200C are arranged from left to right in the order of the second active element T2, the first active element T1, the third active element T3 and the fourth active element T4. In this manner, it is possible to effectively dispose the driving unit 200 including four active elements in the pixel array 101 of the display region AR.

In the embodiments of FIG. 3, FIG. 4A and FIG. 4B, each of the driving units (200A, 200B, 200C) includes four active elements, which should not be construed as a limitation to the disclosure. In other embodiments, the number of the active element in the driving unit is adjusted depending on the need. For example, the following embodiments of FIG. 5 and FIG. 6 exemplify that each of the driving units includes seven active elements.

Figure 5:
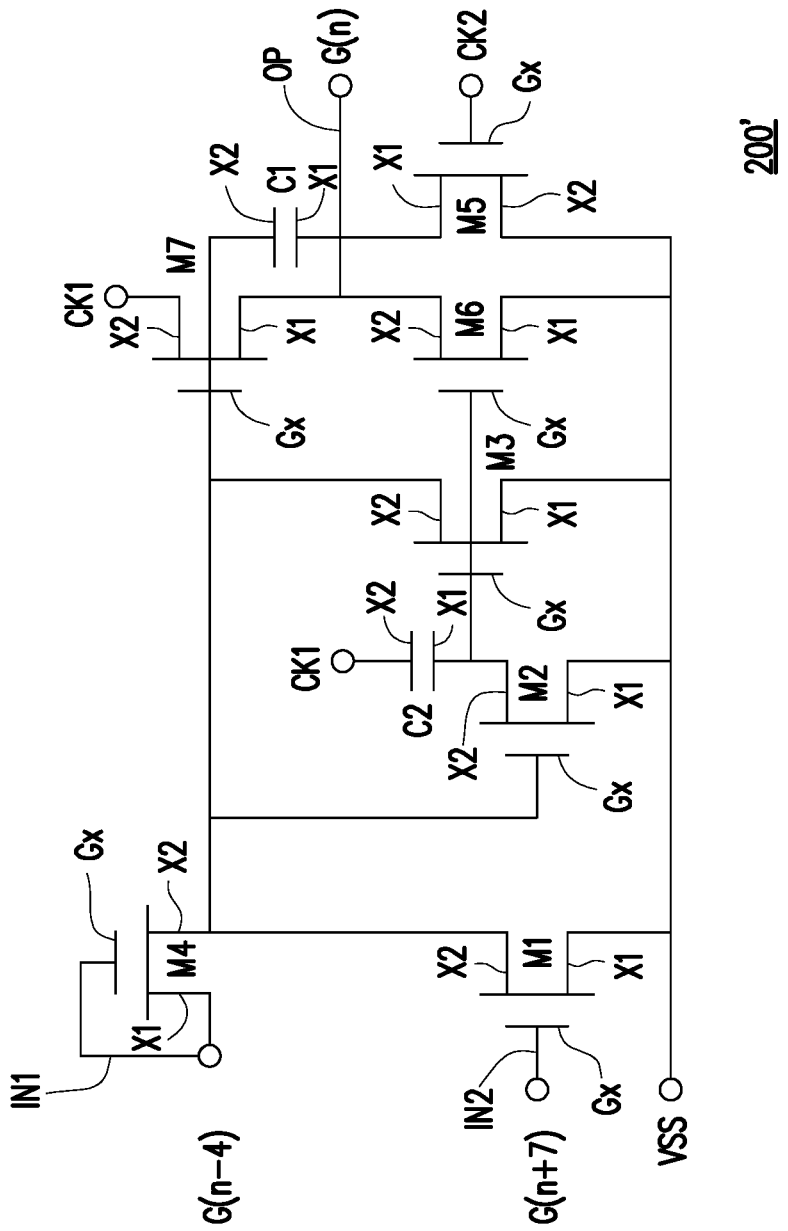
FIG. 5 is a circuit diagram of a driving unit according to another embodiment of the disclosure.

FIG. 5 is a circuit diagram of a driving unit according to another embodiment of the disclosure. In the embodiment, the gate driver circuit in the pixel array 101 in FIG. 2A to FIG. 2C is composed of a plurality of driving units 200′ shown in FIG. 5. In the embodiment, the signal lines SL in FIG. 2A to FIG. 2C, for example, include the power signal line VSS, a first clock signal line CK1, a second clock signal line CK2, the pre-stage input line IN1, the post-stage input line IN2 and the output line OP. Referring to FIG. 5, the driving unit 200′ includes seven active elements (M1-M7).

More specifically, a first active element M1 has the control end Gx, the first end X1 and the second end X2, wherein the control end Gx of the first active element M1 is electrically connected to the post-stage input line IN2, the first end X1 is electrically connected to the power signal line VSS. A second active element M2 has the control end Gx, the first end X1 and the second end X2, wherein the first end X1 of the second active element M2 is electrically connected to the power signal line VSS, and the control end Gx is electrically connected to the second end X2 of the first active element M1. A third active element M3 has the control end Gx, the first end X1 and the second end X2, wherein the control end Gx of the third active element M3 is electrically connected to the second end X2 of the second active element M2, the first end X1 is electrically connected to the power signal line VSS, the second end X2 is electrically connected to the second end X2 of the first active element M1. A fourth active element M4 has the control end Gx, the first end X1 and the second end X2, wherein the control end Gx and the first end X1 of the fourth active element M4 are electrically connected to the pre-stage input line IN2, the second end X2 is electrically connected to the second end X2 of the first active element M1. A fifth active element M5 has the control end Gx, the first end X1 and the second end X2, wherein the control end Gx of the fifth active element M5 is connected to the second clock signal line CK2, the first end X1 is electrically connected to the output line OP, and the second end X2 is electrically connected to the power signal line VSS. A sixth active element M6 has the control end Gx, the first end X1 and the second end X2, wherein the control end Gx of the sixth active element M6 is electrically connected to the second end X2 of the second active element M2, the first end X1 is electrically connected to the power signal line VSS, and the second end X2 is electrically connected to the output line OP. A seventh active element M7 has the control end Gx, the first end X1 and the second end X2, wherein the control end Gx of the seventh active element M7 is electrically connected to the second end X2 of the fourth active element M4, the first end X1 of the seventh active element M7 is electrically connected to the output line OP, and the second end X2 is electrically connected to the first clock signal line CK1.

As shown in FIG. 5, when the output line OP is electrically connected to the Nth gate line G(n), the pre-stage input line IN1 is electrically connected to the N−4th gate line G(n−4), and the post-stage input line IN2 is electrically connected to the N+7th gate line G(n+7), wherein N is an integer. Additionally, in the embodiment of FIG. 5, the driving unit 200' further includes a first capacitor C1 and a second capacitor C2. The first capacitor C1 includes the first end X1 and the second end X2, wherein the first end X1 is connected to the output line OP, and the second end X2 is connected to the second end X2 of the first active element M1. The second capacitor C2 includes the first end X1 and the second end X2, wherein the first end X1 is connected to the second end X2 of the second active element M2, and the second end X2 is connected to the first clock signal line CK1. Based on the electrical connection method shown in FIG. 5, the driving unit 200' is disposed in the pixel array 101 in the manner as shown in FIG. 6.

Figure 6:
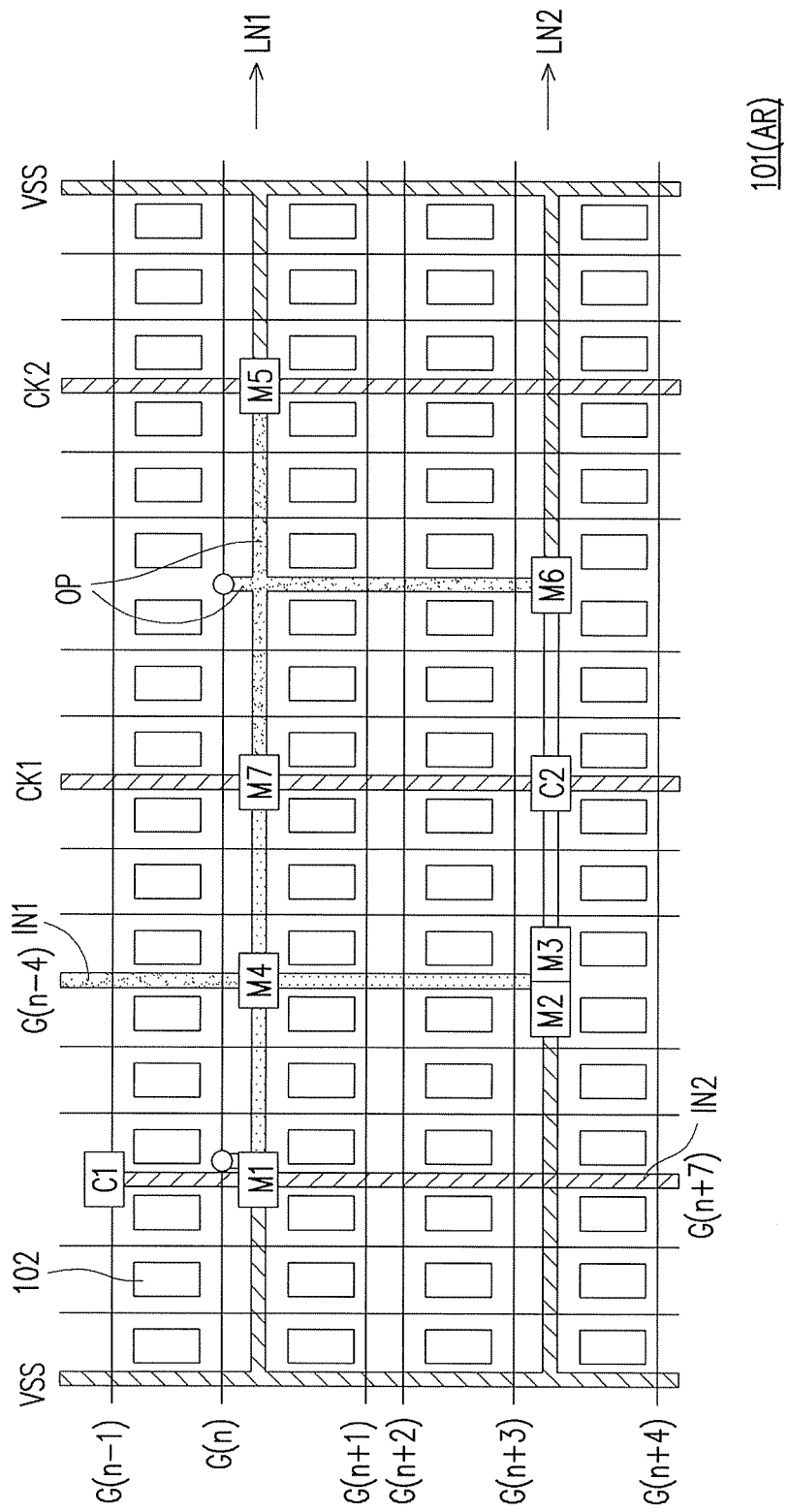
FIG. 6 is a schematic view showing a configuration method of the driving unit according to the embodiment of FIG. 5.

FIG. 6 is a schematic view showing a configuration method of the driving unit according to the embodiment of FIG. 5. As shown in FIG. 6, in the embodiment with seven active elements, the first active element M1, the fourth active element M4, the fifth active element M5 and the seventh active element M7 are disposed on the same horizontal line LN1 along the extending direction of the gate lines (G(n), G(n+1) . . . ), and the second active element M2, the third active element M3 and the sixth active element M6 are disposed on another identical horizontal line LN2 along the extending direction of the gate lines (G(n+3), G(n+4) . . . ). More specifically, the first active element M1, the fourth active element M4, the fifth active element M5 and the seventh active element M7 are disposed between the gate line G(n) and the gate line G(n+1) to be located on the horizontal line LN1. Additionally, the second active element M2, the third active element M3 and the sixth active element M6 are disposed between the gate line G(n+3) and the gate line G(n+4) to be located on the horizontal line LN2. In other words, in the embodiment of FIG. 6, the horizontal line LN1 is disposed in a space between two rows of sub-pixels 102 at both sides of the Nth gate line G(n), and the space thereof is extended along the extending direction of the Nth gate line G(n); the horizontal line LN2 is disposed in the space between two rows of sub-pixels 102 at both sides of the (N+3)th gate line G(n+3), and the space thereof is extended along the extending direction of the (N+3)th gate line G(n+3). In this manner, it is possible to effectively dispose the driving unit 200' including seven active elements in the pixel array 101 of the display region AR.

In summary, according to at least one embodiment of the disclosure, each of the pixel units of the display panel includes three gate lines, two data lines and six sub-pixels. In this manner, there is extra space for the gate driver circuit to be disposed in the pixel array of the display region. Specifically, each of the driving units of the gate driver circuit is disposed in a space between the sub-pixels without the data lines. In this manner, when the gate driver circuit is disposed in the display region, it is possible to achieve the technical effect of reducing cost, significantly decreasing border area and increasing the area of the display region.

The width of each of the plurality of sub-pixels in the embodiments of FIGS. 2-6 in an extending direction of the plurality of date lines is larger than the width of each of the plurality of sub-pixels in an extending direction of the plurality of gate lines. The width of each of the plurality of sub-pixels in the embodiments of FIGS. 7A-11 in an extending direction of the plurality of date lines is larger than the width of each of the plurality of sub-pixels in an extending direction of the plurality of gate lines. In comparison with the embodiments of FIGS. 2-6, the sub-pixels in the embodiments of FIGS. 7A-11 have the different extending direction.

Figure 7A:
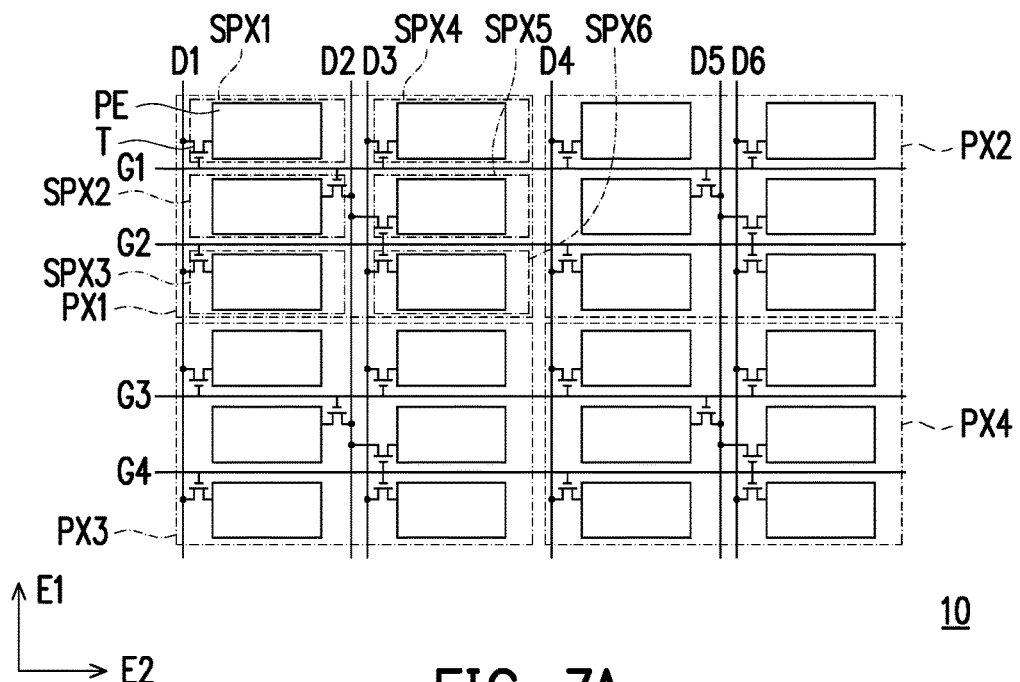
FIG. 7A is a schematic view showing arrangement of a pixel array according to an embodiment of the disclosure.

FIG. 7A is a schematic view showing arrangement of a pixel array according to an embodiment of the disclosure.

As shown in FIG. 7A, a pixel array 10 is, for example, disposed in the display region AR of FIG. 1, and the pixel array 10 is composed of a plurality of pixel units PX1-PX4 arranged repeatedly. The pixel array 10 includes a plurality of gate lines, a plurality of data lines and a plurality of sub-pixels. The pixel units PX1-PX4 respectively include two gate lines, three data lines and six sub-pixels. FIG. 7A is exemplified with four groups of pixel unit PX1, pixel unit PX2, pixel unit PX3 and pixel unit PX4 arranged repeatedly. However, it should be indicated that the display panel 100 actually includes more pixel units arranged repeatedly.

In FIG. 7A, the first to the sixth data lines D1-D6 are arranged in order, and the first to the fourth scan lines G1-G4 are arranged in order. The pixel unit PX1 includes the first data line D1, the second data line D2, the third data line D3, the first gate line G1 and the second gate line G2; the pixel unit PX2 includes the fourth data line D4, the fifth data line D5, the sixth data line D6, the first gate line G1 and the second gate line G2; the pixel unit PX3 includes the first data line D1, the second data line D2, the third data line D3, the third gate line G3 and the fourth gate line G4; the pixel unit PX4 includes the fourth data line D4, the fifth data line D5, the sixth data line D6, the third gate line G3 and the fourth gate line G4. There is no gate line and data line between two adjacent pixel units PX1-PX4.

In the embodiment, the pixel unit PX2, the pixel unit PX3 and the pixel unit PX4 are disposed in the same manner as the pixel unit PX1; therefore, only the pixel unit PX1 is described for exemplary purpose.

The pixel unit PX1 includes the first to the sixth sub-pixels SPX1-SPX6. Each of the sub-pixels among the first to the sixth sub-pixels includes one switch element T and one pixel electrode PE. The pixel electrode PE is electrically connected to the switch element T.

In the embodiment, the width of the first to the sixth sub-pixels SPX1-SPX6 in an extending direction E2 of the first to the fourth gate lines G1-G4 is larger than the width of the first to the sixth sub-pixels SPX1-SPX6 in an extending direction E1 of the first to the sixth data lines D1-D6. For example, the width of the switch element T and the pixel electrode PE in the extending direction E2 of the first to the fourth gate lines G1-G4 is larger than the width of the switch element T and the pixel electrode PE in the extending direction E1 of the first to the sixth data lines D1-D6. Specifically, take the second sub-pixel SPX2 as an example, the second sub-pixel SPX2 is defined by the first gate line G1, the second gate line G2, the first data line D1 and the second data line D2. The width of the second sub-pixel SPX2 in the extending direction E2 is approximately the maximum distance between the first data line D1 and the second data line D2, for example, and the width of the second sub-pixel SPX2 in the extending direction E1 is approximately the maximum distance between the first gate line G1 and the second gate line G2, for example. In the embodiment, the widths of the first to the sixth sub-pixels SPX1-SPX6 in the extending direction E2 are approximately the same, and the widths of the first to the sixth sub-pixels SPX1-SPX6 in the extending direction E1 are approximately the same. In the embodiment, in each of the sub-pixels, the width in the extending direction E2 is larger than the width in the extending direction E1, which is suitable for a display device having long shape such as the display device applied to rearview mirror of vehicle, which should not be construed as a limitation to the disclosure.

In the pixel unit PX1 of the embodiment, the first to the sixth sub-pixels SPX1-SPX6 are electrically connected to one of the gate lines and one of the data lines respectively. Specifically, the switch element T of the first sub-pixel SPX1 is electrically connected to the first gate line G1 and the first data line D1 respectively. The switch element T of the second sub-pixel SPX2 is electrically connected to the first gate line G1 and the second data line D2 respectively. The switch element T of the third sub-pixel SPX3 is electrically connected to the second gate line G2 and the first data line D1 respectively. The switch element T of the fourth sub-pixel SPX4 is electrically connected to the first gate line G1 and the third data line D3 respectively. The switch element T of the fifth sub-pixel SPX5 is electrically connected to the second gate line G2 and the second data line D2 respectively. The switch element T of the sixth sub-pixel SPX6 is electrically connected to the second gate line G2 and the third data line D3 respectively.

In the embodiment of FIG. 7A, the first and the second gate lines G1 and G2 are arranged in order, and the second sub-pixel SPX2 and the fifth sub-pixel SPX5 are disposed between the first gate line G1 and the second gate line G2. In the embodiment of FIG. 7A, the first to the third data lines D1-D3 are arranged in order, the first sub-pixel SPX1, the second sub-pixel SPX2 and the third sub-pixel SPX3 are disposed between the first data line D1 and the second data line D2, and there is no sub-pixel between the second data line D2 and the third data line D3. In the embodiment, the pixel units PX1-PX4 in the pixel array 10 are exemplified as rectangular shape, which should not be construed as a limitation to the disclosure. In other embodiments, the shape of the pixel units PX1-PX4 is a like-V shape. In the embodiment, the first to the fourth gate lines G1-G4 and the first to the sixth data lines D1-D6 that define the pixel units PX1-PX4 are exemplified as linear shape, which should not be construed as a limitation to the disclosure. In other embodiments, the first to the fourth gate lines G1-G4 and/or the first to the sixth data lines D1-D6 that define the pixel units PX1-PX4 may have a zigzag shape or other shapes.

Figure 7B:
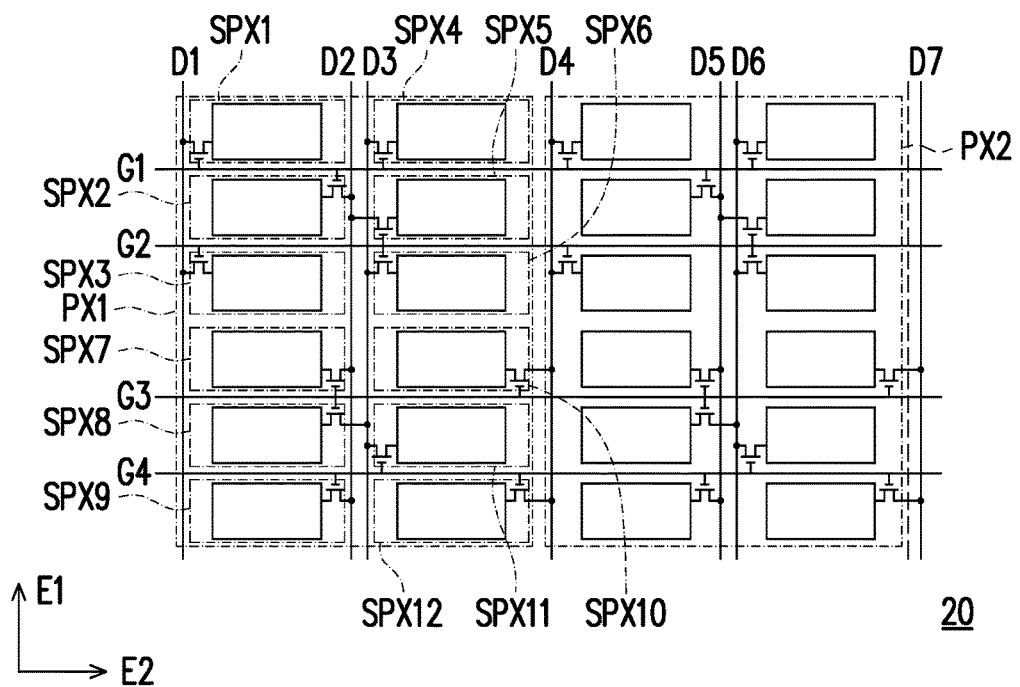
FIG. 7B is a schematic view showing arrangement of a pixel array according to an embodiment of the disclosure.

FIG. 7B is a schematic view showing arrangement of a pixel array according to an embodiment of the disclosure. It should be indicated that the embodiment of FIG. 7B uses the reference numeral and a part of content of the embodiment of FIG. 7A, wherein the same or similar reference numerals are used to represent the same or similar elements, and the same technical content is omitted. The previous embodiments may serve as reference for the omitted descriptions, and thus no repetition is incorporated herein.

As shown in FIG. 7B, a pixel array 20 is composed of a plurality of pixel units PX1 and PX2 arranged repeatedly. In the embodiment, the pixel unit PX2 is disposed in a similar manner as the pixel unit PX1; therefore, only the pixel unit PX1 is described for exemplary purpose.

In FIG. 7B, the first to the seventh data lines D1-D7 are arranged in order, and the first to the fourth scan lines G1-G4 are arranged in order. Specifically, the pixel unit PX1 includes the first to the third data lines D1-D3 and the first to the fourth gate lines G1-G4; the pixel unit PX2 includes the fourth to the sixth data lines D4-D6 and the first to the fourth gate lines G1-G4. There is no gate line and data line between the pixel unit PX1 and the pixel unit PX2.

The pixel unit PX1 includes the first to the third data lines D1-D3, the first to the fourth gate lines G1-G4 and the first to the twelfth sub-pixels SPX1-SPX12. The widths of the first to the twelfth sub-pixels SPX1-SPX12 in the extending direction E1 and the extending direction E2 in the embodiment of FIG. 7B are approximately the same as the width of the second sub-pixel SPX2 in the embodiment of FIG. 7A, and thus no repetition is incorporated herein.

Each of the sub-pixels among the first to the twelfth sub-pixels SPX1-SPX12 includes one switch element T and one pixel electrode PE, and the pixel electrode PE is electrically connected to the switch element T.

In the embodiment of FIG. 7B, the first to the twelfth sub-pixels SPX1-SPX12 are electrically connected to one of the gate lines and one of the data lines respectively. The first to the sixth sub-pixels SPX1-SPX6 in the embodiment of FIG. 7B are similar to the first to the sixth sub-pixels SPX1-SPX6 in the embodiment of FIG. 7A, and thus no repetition is incorporated herein.

The switch element T of the seventh sub-pixel SPX7 is electrically connected to the third gate line G3 and the second data line D2 respectively. The switch element T of the eighth sub-pixel SPX8 is electrically connected to the third gate line G3 and the third data line D3 respectively. The switch element T of the ninth sub-pixel SPX9 is electrically connected to the fourth gate line G4 and the second data line D2 respectively. The switch element T of the tenth sub-pixel SPX10 is electrically connected to the third gate line G3 and the fourth data line D4 respectively, wherein the fourth data line D4 is an element in the pixel unit PX2, and the pixel unit PX2 is adjacent to the pixel unit PX1. The switch element T of the eleventh sub-pixel SPX11 is electrically connected to the fourth gate line G4 and the third data line D3 respectively. The switch element T of the twelfth sub-pixel SPX12 is electrically connected to the fourth gate line G4 and the fourth data line D4 respectively.

In the embodiment of FIG. 7B, the first to the fourth gate lines G1-G4 are arranged in order, the second sub-pixel SPX2 and the fifth sub-pixel SPX5 are disposed between the first gate line G1 and the second gate line G2, the eighth sub-pixel SPX8 and the eleventh sub-pixel SPX11 are disposed between the third gate line G3 and the fourth gate line G4. In the embodiment, there is no gate line between the third sub-pixel SPX3 and the seventh sub-pixel SPX7 as well as the sixth sub-pixel SPX6 and the tenth sub-pixel SPX10 of the pixel unit 10. The first to the third data lines D1-D3 are arranged in order, the seventh sub-pixel SPX7, the eighth sub-pixel SPX8 and the ninth sub-pixel SPX9 are disposed between the first data line D1 and the second data line D2, and there is sub-pixel between the second data line D2 and third data line D3.

Figure 8:
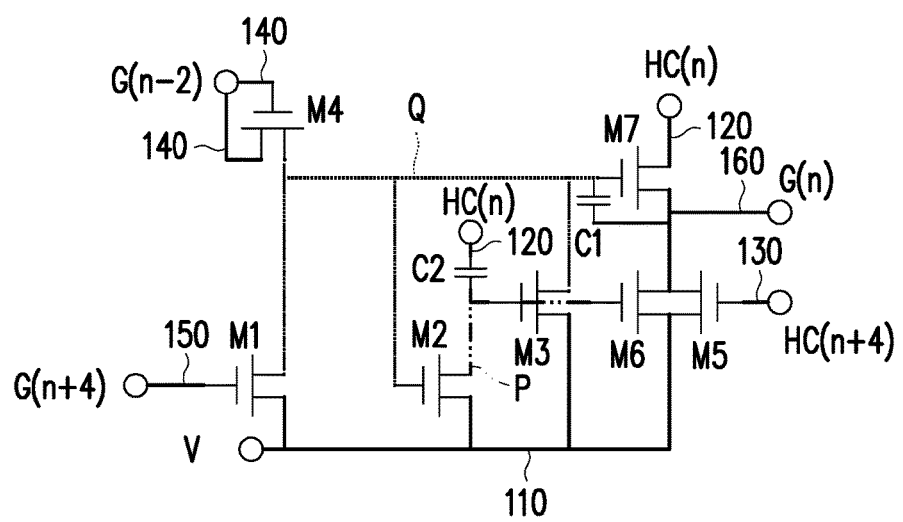
FIG. 8 is a circuit diagram of a driving unit according to an embodiment of the disclosure.

FIG. 8 is a circuit diagram of a driving unit according to an embodiment of the disclosure.

Referring to FIG. 8, the pre-stage input line 140, the post-stage input line 150 and the output line 160 are respectively connected to three gate lines. The power signal line 110 is electrically connected to voltage V, and the voltage V is, for example, a voltage supplied by a power supply or a ground voltage.

In the embodiment of FIG. 8, the driving unit includes the first active element M1, the second active element M2, the third active element M3, the fourth active element M4, the fifth active element M5, the sixth active element M6 and the seventh active element M7, wherein each of the active elements has the control end, the first end and the second end. Specifically, the control end of the first active element M1 is electrically connected to the post-stage input line 150, and the second end is electrically connected to the power signal line 110. The control end of the second active element M2 is electrically connected to the first end of the first active element M1, and the second end thereof is electrically connected to the power signal line 110. The control end of the third active element M3 is electrically connected to the first end of the second active element M2, the first end is electrically connected to the first end of the first active element M1, and the second end is electrically connected to the power signal line 110. Additionally, the control end and the first end of the fourth active element M4 are electrically connected to the pre-stage input line 140, and the second end is electrically connected to the first end of the first active element M1. The control end of the fifth active element M5 is electrically connected to the second clock signal line 130, the first end is electrically connected to the output line 160, and the second end is electrically connected to the power signal line 110. Furthermore, the control end of the sixth active element M6 is electrically connected to the first end of the second active element M2, the first end is electrically connected to the output line 160, and the second end is electrically connected to the power signal line 110. In the seventh active element M7, the control end is electrically connected to the first end of the first active element M1, and the first end is electrically connected to the first clock signal line 120, and the second end is electrically connected to the output line 160.

In the embodiment, the driving unit further includes the first capacitor C1 and the second capacitor C2. The first capacitor C1 is electrically connected to the output line 160 and the first end of the first active element M1 respectively. In other words, the first capacitor C1 is formed between the control end and the second end of the seventh active element M7. The second capacitor C2 is electrically connected to the first clock signal 120 and the first end of the second active element M2 respectively. In other words, the second capacitor C1 is formed between the first end of the seventh active element M7 and the first end of the second active element M2.

In the embodiment, the first end of the first active element M1, the control end of the second active element M2, the first end of the third active element M3, the second end of the fourth active element M4, the control end of the seventh active element M7 and the first capacitor C1 are electrically connected to a signal node Q. That is to say, the end of each of the active elements is coupled to each other through the signal node Q. In the embodiment, the first end of the second active element M2, the control end of the third active element M3, the control end of the sixth active element M6 and the second capacitor C2 are electrically connected to a signal node P. Similarly, the end of each of the active elements is coupled to each other through the signal node P. In some embodiments, the signal node Q and the signal node P generate a floating signal such as a floating voltage (non-fixed voltage).

Figure 9:
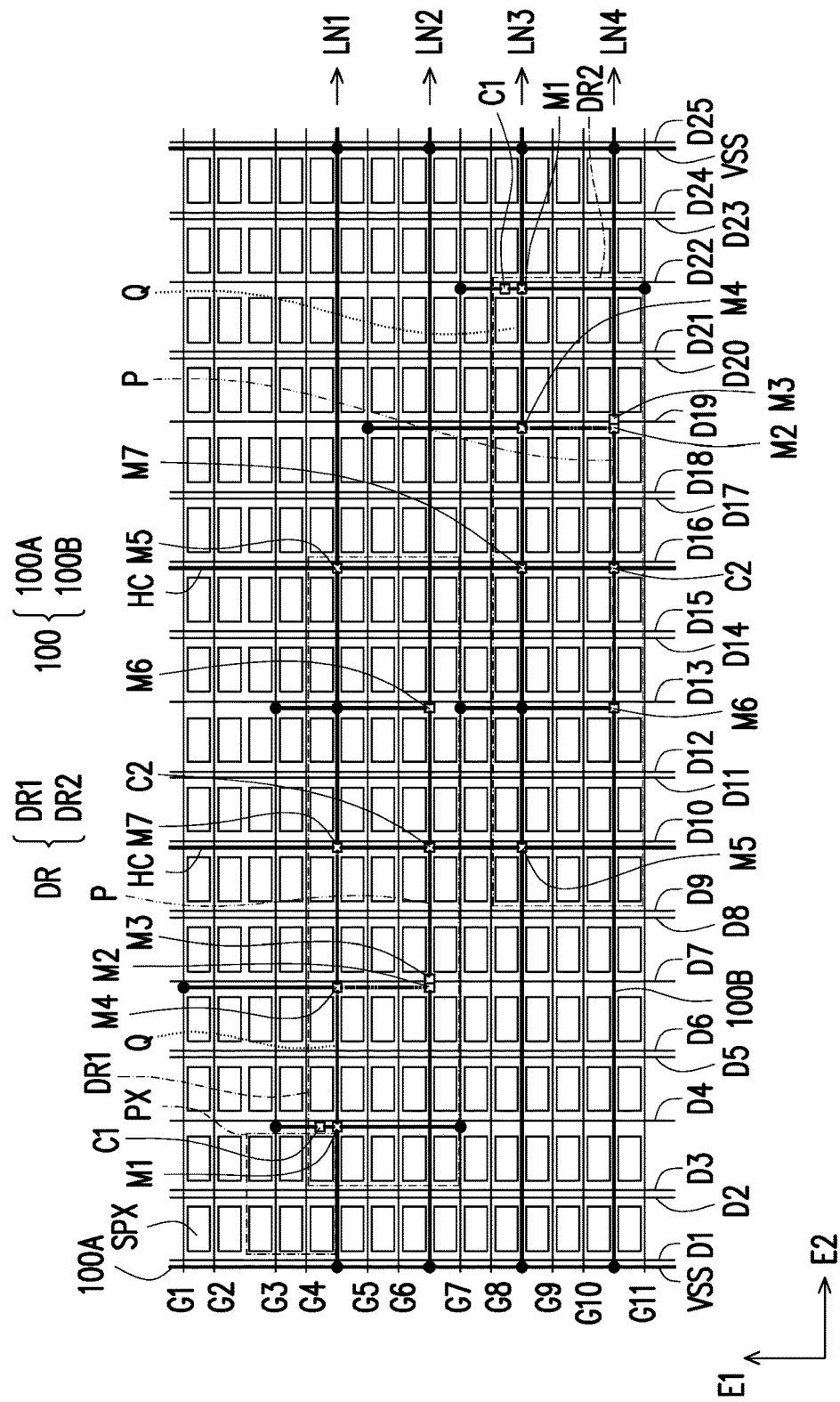
FIG. 9 is a schematic view showing a configuration method of a driving unit according to an embodiment of the disclosure.

FIG. 9 is a schematic view showing a configuration method of a driving unit according to an embodiment of the disclosure. It should be indicated that the embodiment of FIG. 9 uses the reference numerals and partial descriptions used in the embodiments of FIG. 1, FIG. 7A, FIG. 7B and FIG. 8, wherein the same or similar reference numerals are used to represent the same or similar elements, and the same technical content is omitted. The previous embodiments serve as the reference for the omitted descriptions and thus no repetition is incorporated herein.

The gate driver circuit DR is disposed in the pixel array (including the first to the eleventh gate lines G1-G11, the first to the twenty-fifth data lines D1-D25 and a plurality of sub-pixels SPX). It should be pointed out that although FIG. 9 only illustrates one pixel unit PX, it is simply shown for exemplary purpose. In fact, FIG. 9 includes a plurality of pixel units PX arranged repeatedly. Additionally, the plurality of the pixel units PX in FIG. 9 are exemplified as the plurality of the pixel units PX including six sub-pixels SPX (e.g., pixel array 10 in FIG. 7A), which should not be construed as a limitation to the disclosure. The pixel unit PX also includes twelve sub-pixels SPX (e.g., pixel array 20 in FIG. 7B).

In the embodiment, there is no need to dispose gate line between a portion of adjacent sub-pixels SPX (and/or pixel units PX), and there is no need to dispose data line between a portion of adjacent sub-pixels SPX (and/or pixel units PX). Accordingly, the gate driver circuit DR is correspondingly disposed in a region between the adjacent sub-pixels SPX (and/or pixel units PX).

In the embodiment, the gate driver circuit DR includes a plurality of the first to the seventh active elements M1-M7 and a plurality of signal lines 100 (bolded lines in FIG. 9, including solid line, dashed line and dotted line). The first to the seventh active elements M1-M7 are disposed between two adjacent pixel units PX and/or two adjacent sub-pixels SPX. The plurality of signal lines 100 are disposed between two adjacent pixel units PX and/or two adjacent sub-pixels SPX.

In the embodiment, the gate driver circuit DR has a plurality of driving units, for example, includes a first driving unit DR1 and a second driving unit DR2. The first driving unit DR1 and the second driving unit DR2 respectively includes the first to the seventh active elements M1-M7, the plurality of signal lines 100 and the plurality of capacitors C1 and C2. The signal lines 100 include a signal line 100A that is substantially parallel with the first to the twenty-fifth data lines D1-D25 as well as a signal line 100B that is substantially parallel with the first to the eleventh gate lines G1-G11. In some embodiments, the signal line 100A and the data line are formed simultaneously, and the signal line 100B and the gate line are formed simultaneously, which should not be construed as a limitation to the disclosure. A portion of the signal line 100A and a portion of the signal line 100B are electrically connected, and a portion of the signal line 100A and a portion of the signal line 100B are electrically isolated from each other. In the embodiment, the signal line 100, the first to the eleventh gate lines G1-G11 and the first to the twenty-fifth data lines D1-D25 are exemplified with linear shape, which should not be construed as a limitation to the disclosure. In other embodiments, the signal line 100, the first to the eleventh gate lines G1-G11 and the first to the twenty-fifth data lines D1-D25 are formed in a zigzag shape or other shapes.

Referring to FIG. 8 and FIG. 9, the signal line 100 includes the power signal line 110, the first clock signal line 120, the second clock signal line 130, the pre-stage input line 140, the post-stage input line 150 and the output line 160. The pre-stage input line 140, the post-stage input line 150 and the output line 160 are respectively connected to three gate lines. The power signal line 110 is electrically connected to the voltage V, and the voltage V is, for example, a voltage supplied by a power supply or a ground voltage.

In the embodiment, the arrangement of the first to the seventh active elements M1-M7 of the first driving unit DR1 is mirror symmetrical to the arrangement of the first to the seventh active elements M1-M7 of the second driving unit DR2. For example, in the first driving unit DR1, the fourth active element M4 is on the right side of the first active element M1 and the left side of the seventh active element M7. However, in the second driving unit DR2, the fourth active element M4 is on the left side of the first active element M1 and the right side of the seventh active element M7. In the first driving unit DR1, the seventh active element M7 is on the right side of the fourth active element M4 and the left side of the fifth active element M5. However, in the second driving unit DR2, the seventh active element M7 is on the left side of the fourth active element M4 and the right side of the fifth active element M5. In the first driving unit DR1, the second active element M2 and/or the third active element M3 are on the left side of the sixth active element M6. However, in the second driving unit DR2, the second active element M2 and/or the third active element M3 are on the right side of the sixth active element M6. It should be indicated that, in the first driving unit DR1 and the second driving unit DR2, the second active element M2 and the third active element M3 are disposed in the same region. Accordingly, in the embodiment, the second active element M2 and the third active element M3 are regarded as a whole.

In another view, in the first driving unit DR1 in FIG. 8, the arrangement from left to right includes the first active element M1 (and/or first capacitor C1), the fourth active element M4 (and/or second active element M2, third active element M3), the seventh active element M7 (and/or second capacitor C2), the sixth active element M6 and the fifth active element M5 in order. In the second driving unit DR2 of FIG. 8, the arrangement from right to left includes the first active element M1 (and/or first capacitor C1), the fourth active element M4 (and/or the second active element M2, the third active element M3), the seventh active element M7 (and/or the second capacitor C2), the sixth active element M6 and the fifth active element M5. Specifically, the left side of FIG. 8 is, for example, defined as one side close to the first data line D1, and the right side is, for example, defined as one side close to the twenty-fifth data line D25. In this manner, the relative configuration position of each of the elements of the first driving unit DR1 is mirror symmetrical to the relative configuration position of each of the elements of the second driving unit DR2.

Referring to FIG. 9, the signal line 100A and the signal line 100B for the first driving unit DR1 and the second driving unit DR2 are disposed between two adjacent subpixels SPX. In the meantime, referring to FIG. 7A or FIG. 7B, in the pixel array 10, there is no data line or gate line provided between a portion of two adjacent columns or two adjacent rows of sub-pixels. Therefore, the embodiment describes that the first driving unit DR1 and the second driving unit DR2 are disposed in the space thereof (the space in which no data line or gate line is provided), and the plurality of the driving units DR are disposed in the display region AR to achieve the effect of narrow border area. In the embodiment, the first active element M1, the fourth active element M4, the fifth active element M5 and the seventh active element M7 of the first driving unit DR1 are disposed on the same horizontal line LN1 along the extending direction E2 of the gate line, and the second active element M2, the third active element M3 and the sixth active element M6 are disposed on another identical horizontal line LN2 along the extending direction E2 of the gate line.

In the embodiment, the first active element M1, the fourth active element M4, the fifth active element M5 and the seventh active element M7 of the second driving unit DR2 are disposed on the same horizontal line LN3 along the extending direction E2 of the gate line, and the second active element M2, the third active element M3 and the sixth active element M6 are disposed on another identical horizontal line LN4 along the extending direction E2 of the gate line.

For example, the configuration of "on the same horizontal line" refers to that at least a portion of the active elements of the driving unit is disposed in a space between two adjacent gate lines. Take the first active element M1, the fourth active element M4, the fifth active element M5 and the seventh active element M7 of the driving unit DR1 in FIG. 9 as an example, the first active element M1, the fourth active element M4, the fifth active element M5 and the seventh active element M7 of the first driving unit DR1 are disposed in the space between the fourth gate line G4 and the fifth gate line G5, and the space thereof is extended along the extending direction E2 of the gate line.

Accordingly, in the embodiment, the first active element M1, the fourth active element M4, the fifth active element M5 and the seventh active element M7 of the first driving unit DR1 are disposed in the same space, and the second active element M2, the third active element M3 and the sixth active element M6 are disposed in the same space. The first active element M1, the fourth active element M4, the fifth active element M5 and the seventh active element M7 of the second driving unit DR2 are disposed in the same space, and the second active element M2, the third active element M3 and the sixth active element M6 are disposed in the same space. The above-mentioned same space refers to a space between two adjacent gate lines, which is also described as being disposed on "the same horizontal line."

Although the configuration "on the same horizontal line" described above is exemplified with the configuration in the space between two adjacent gate lines, the disclosure provides no limitation thereto. In some embodiments, the configuration on "the same horizontal line" is exemplified with the configuration between two adjacent rows of sub-pixels SPX. Take FIG. 9 as an example, "the configuration on the same horizontal line LN1" represents the configuration between the fifth row of sub-pixel SPX and the sixth sub-pixel SPX counted from the top.

In some embodiments, the shorter the signal line that is electrically connected to the signal node Q and the signal node P, a better quality of the display panel is achieved. In the embodiment, the first capacitor C1 is adjacent to the first active element M1, for example, located between four identical pixel units PX that are adjacent to each other, and the second active element M2 is adjacent to the third active element M3, for example, located between four identical pixel units PX that are adjacent to each other. In this manner, the signal line that is electrically connected to the signal node Q and the signal node P can be shorter.

In some embodiments, the clock signal of the display panel is formed in groups of one, two, four, eight or sixteen. In the embodiment of the disclosure, gate driver circuits DR includes a plurality of the driving units, for example, includes the first driving unit DR1 and the second driving unit DR2, and the plurality of driving units are connected in series to form a multi-stage shift register circuit to provide driving signal to each of the gate lines. In the embodiment of FIG. 9, the clock signal is grouped in the number of eight, the first clock signal 120 of the first driving unit DR1 is electrically connected to a third-stage (n=3) clock signal HC3, and the first driving unit DR1 generates the driving signal of the third-stage gate line (third gate line G3), and n=3, for example, please also refer to the circuit diagram of FIG. 8. When the first driving unit DR1 generates the driving signal (i.e., n=3) of the third-stage gate line (third gate line G3), the output line 160 thereof is electrically connected to the third-stage gate line (third gate line G3), the pre-stage input line 140 is electrically connected to the first-stage gate line (first gate line G1), the post-stage input line 150 is electrically connected to the seventh-stage gate line (seventh gate line G7), the first clock signal line 120 is electrically connected to a third-stage clock signal HC3 and the second clock signal line 130 is electrically connected to a seventh-stage clock signal HC7. The rest is deduced from the above. When the second driving unit DR2 generates the driving signal (i.e., n=7) of the seventh-stage gate line (seventh gate line G7), the output line 160 thereof is electrically connected to the seventh-stage gate line (seventh gate line G7), the pre-stage input line 140 is electrically connected to the fifth-stage gate line (fifth gate line G5), the post-stage input line 150 is electrically connected to the eleventh-stage gate line (eleventh gate line G11), the first clock signal line 120 is electrically connected to the seventh-stage clock signal HC7 and the second clock signal line 130 is electrically connected to an eleventh-stage clock signal HC11 (i.e., HC3).

In other words, in the embodiment of FIG. 9, the first clock signal line 120 of the first driving unit DR1 is electrically connected to the second clock signal line 130 of the second driving unit DR2, and the second clock signal line 130 of the first driving unit DR1 is electrically connected to the first clock signal line 120 of the second driving unit DR2.

FIG. 10A-FIG. 10D are schematic views showing a configuration method of a driving unit according to an embodiment of the disclosure. It should be indicated that the embodiments of FIG. 10A-FIG. 10D use the reference numerals and partial descriptions used in the embodiment of FIG. 8, wherein the same or similar elements are represented by the same or similar reference numerals, and the same technical content is omitted. The previous embodiments serve as reference for the omitted descriptions, and thus no repetition is incorporated herein.

Figure 10A:
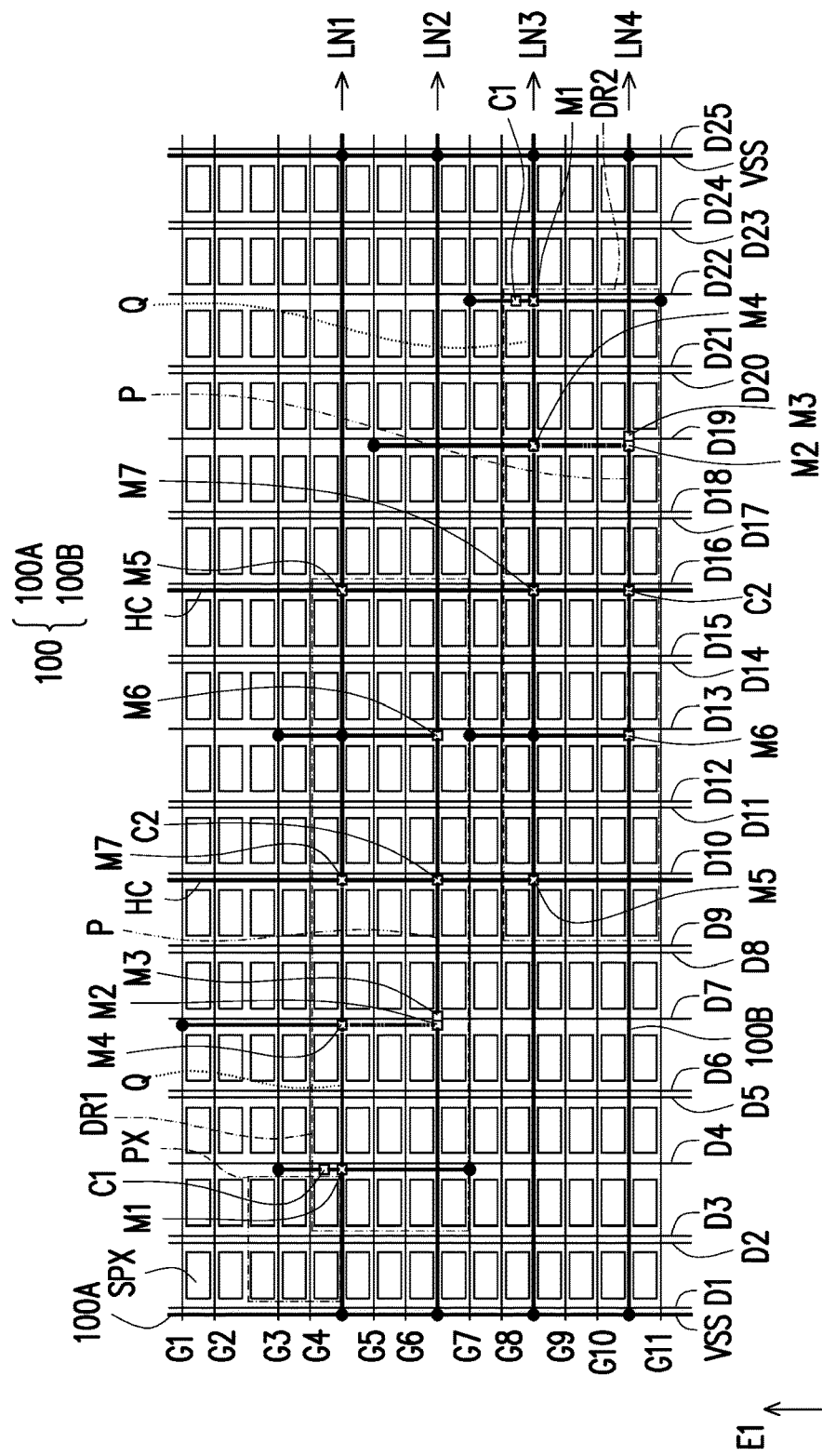
FIG. 10A-FIG. 10D are schematic views showing a configuration method of a driving unit according to an embodiment of the disclosure.
Figure 10B:
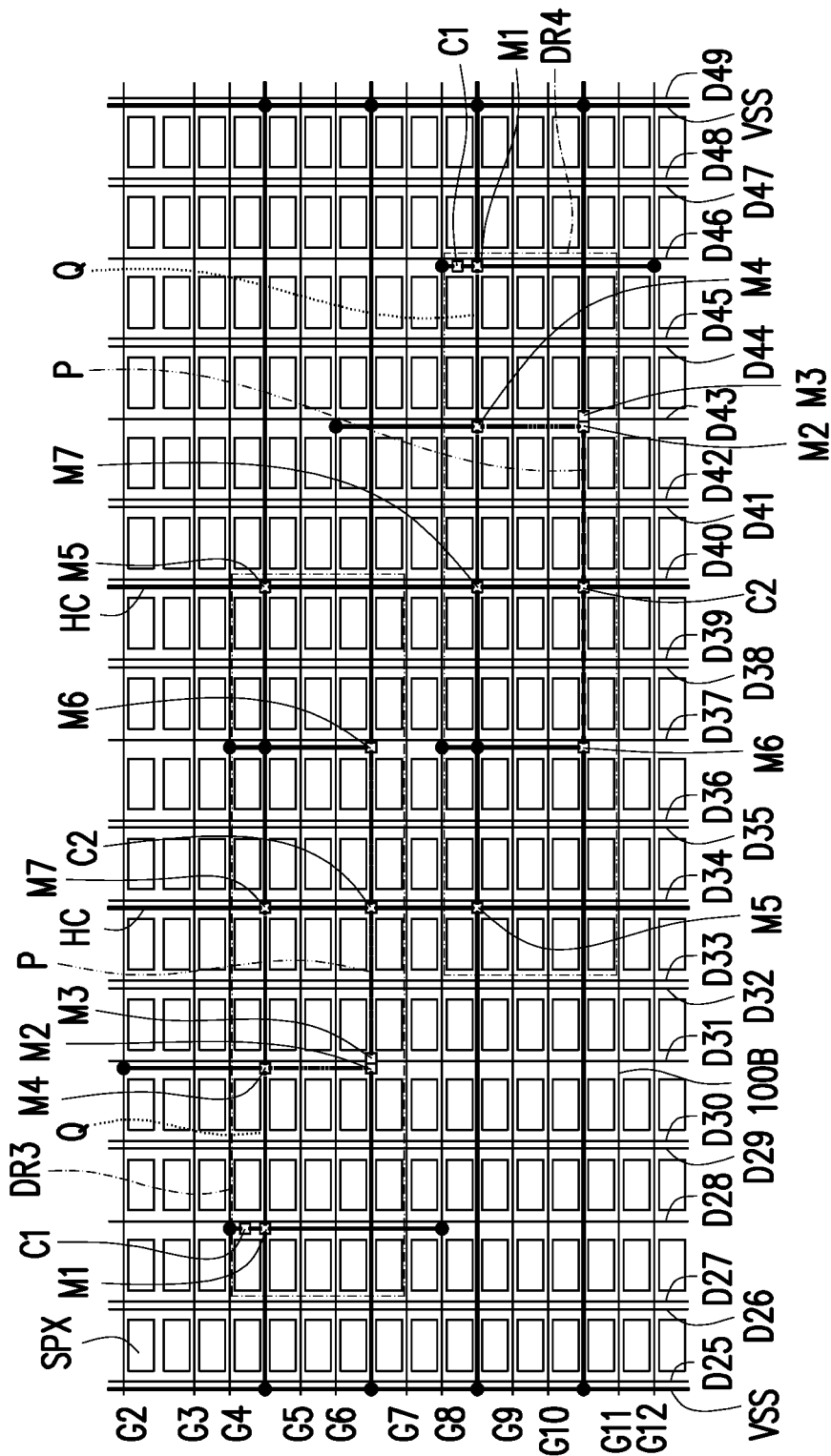
Figure 10C:
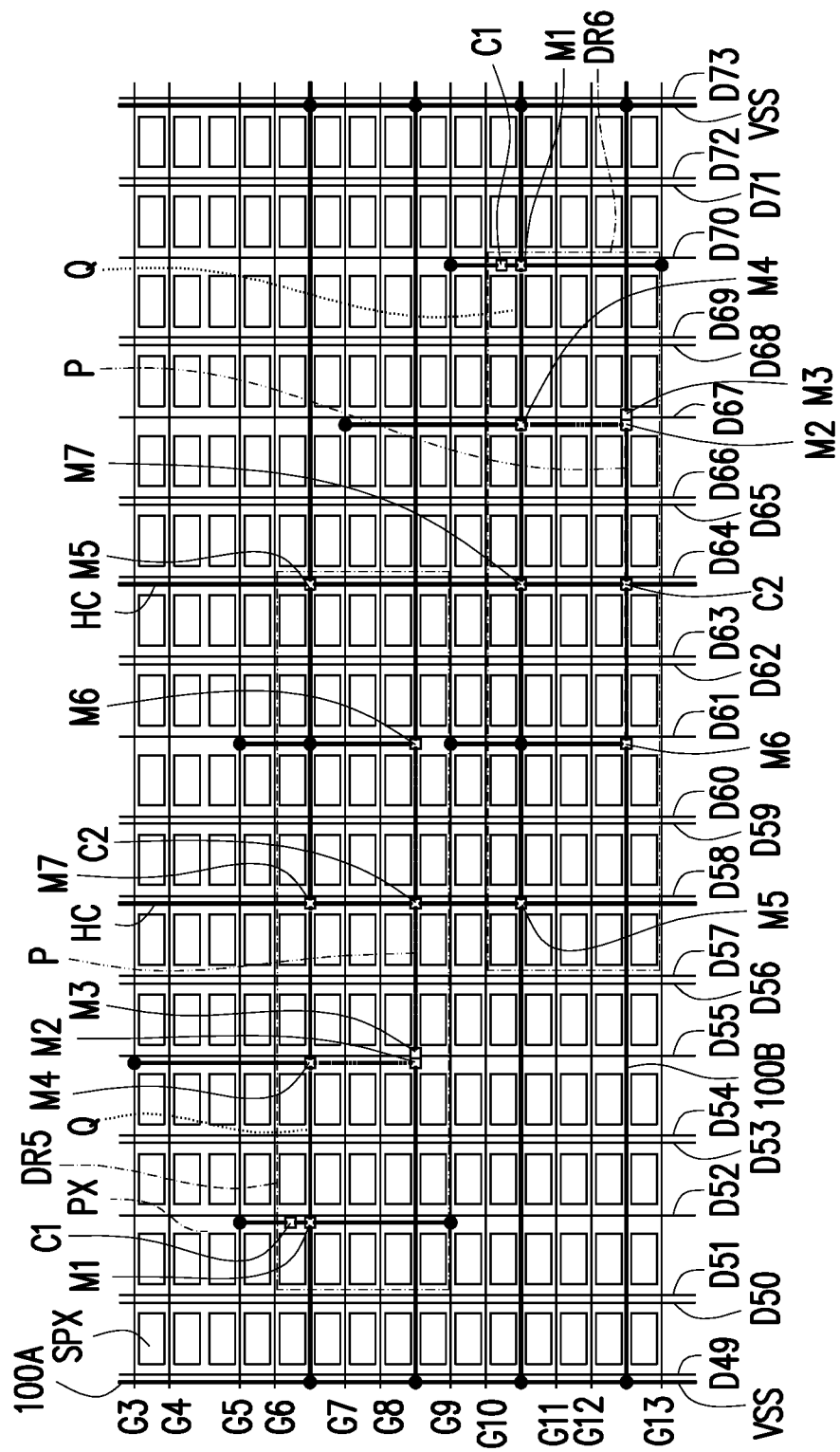
Figure 10D:
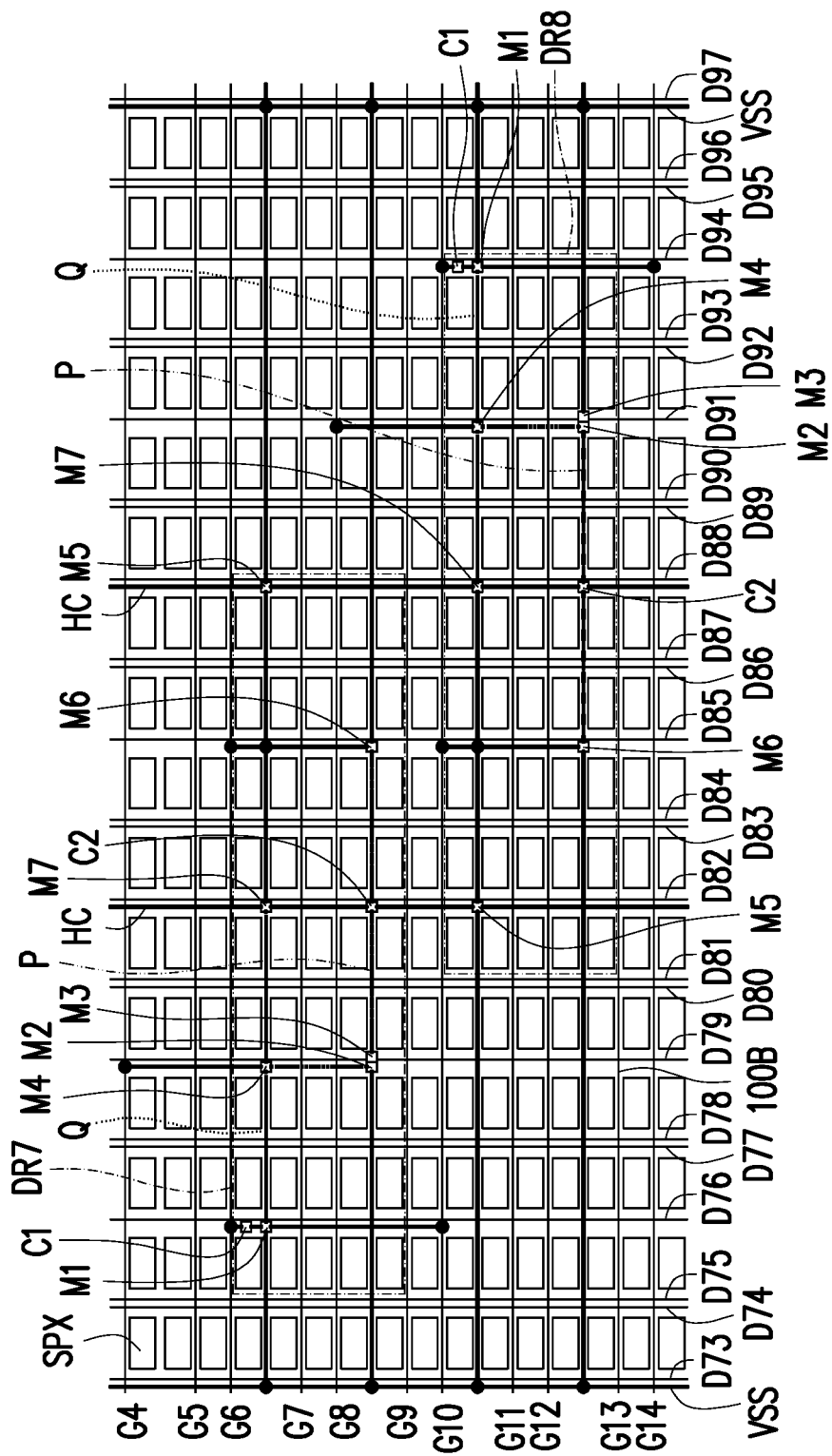

Referring to FIG. 10A-FIG. 10D, FIG. 10A-FIG. 10D are, for example, schematic views showing different portions of the display panel in the same embodiment. FIG. 10A illustrates a portion including the first to the eleventh gate lines G1-G11 and the first to the twenty-fifth data lines D1-D25; FIG. 10B illustrates a portion including the second to the twelfth gate lines G2-G12 and the twenty-fifth to the forty-ninth data lines D25-D49; FIG. 10C illustrate a portion including the third to the thirteenth gate lines G3-G13 and a portion including the forty-ninth to the seventy-third data lines D49-D73; FIG. 10D illustrates a portion including the fourth to the fourteenth gate lines G4-G14 and the seventy-third to the ninety-seventh data lines D73-D97.

The main difference between the embodiments of FIG. 10A-FIG. 10D and the embodiment of FIG. 9 is that the embodiment of FIG. 9 is exemplified with the first driving unit DR1 and the second driving unit DR2 as a group of repeated units, whereas the embodiments of FIG. 10A-FIG. 10D are exemplified with the first to the eighth driving units DR1-DR8 as a group of repeated units. Different groups of repeated units are, for example, electrically connected to different stages of gate lines.

In the embodiment, the gate lines include the first to the fourteenth gate lines G1-G14 arranged in order. The output line 160 (shown in FIG. 8) of the first, the third, the fifth and the seventh driving units DR1, DR3, DR5, DR7 are electrically connected to the third to the sixth gate lines G3-G6 respectively. In other words, the first, the third, the fifth and the seventh driving units DR1, DR3, DR5 and DR7 respectively generate the driving signals of the third-stage to the sixth-stage (n=3-n=6) gate lines. The pre-stage input line 140 (shown in FIG. 8) is electrically connected to the first to the fourth gate lines G1-G4 respectively, and the post-stage input line 150 (shown in FIG. 8) is electrically connected to the seventh to the tenth gate lines G7-G10 respectively.

The output line 160 (shown in FIG. 8) of the second, the fourth, the sixth and the eighth driving units DR2, DR4, DR6 and DR8 are electrically connected to the seventh to tenth gate lines G7-G10 respectively. In other words, the second, the fourth, the sixth and the eighth driving units DR2, DR4, DR6 and DR8 respectively generate the driving signals of the seventh-stage to the tenth-stage (n=7-n=10) gate lines. The pre-stage input line 140 is electrically connected to the fifth to the eighth gate lines G5-G8 respectively. The post-stage input line 150 (shown in FIG. 8) is electrically connected to the eleventh to the fourteenth gate lines G11-G14 respectively.

In the embodiment, respective active elements of the first, the third, the fifth and the seventh driving units DR1, DR3, DR5 and DR7 are formed in similar arrangement, and respective active elements of the second, the fourth, the sixth and the eighth driving units DR2, DR4, DR6 and DR8 are formed in similar arrangement. The arrangement of the active elements of the first, the third, the fifth and the seventh driving units DR1, DR3, DR5 and DR7 is mirror symmetrical to the arrangement of the active elements of the second, the fourth, the sixth and the eight driving units DR2, DR4, DR6 and DR8. If FIG. 10A-FIG. 10D are combined together, the active elements of the first to the fourth driving units DR1-DR4, after which are moved downward and then moved to the right, can be overlapped with the active elements of the fifth to the eighth driving units DR5-DR8.

Figure 11:
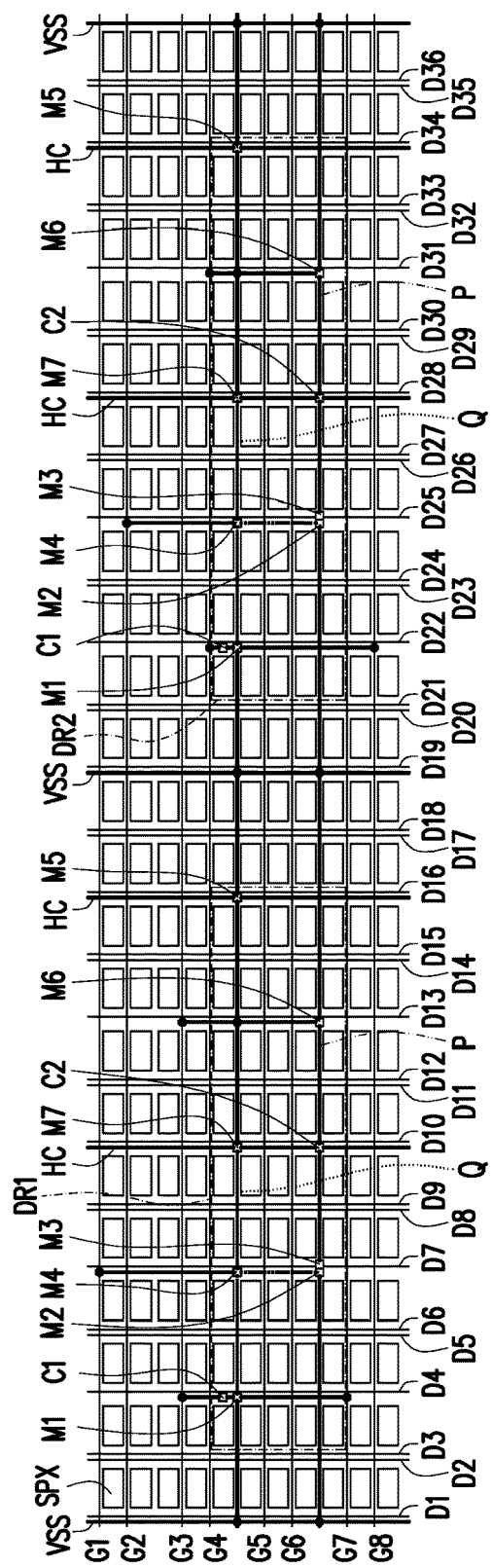
FIG. 11 is a schematic view showing a configuration method of a driving unit according to an embodiment of the disclosure.

FIG. 11 is a schematic view showing a configuration method of a driving unit according to an embodiment of the disclosure. It should be indicated that the embodiment of FIG. 11 uses the reference numerals and a part of the content in the embodiment of FIG. 8, wherein the same or similar elements are represented by the same or similar reference numerals, and the same technical content is omitted. The previous embodiments serve the reference for the omitted descriptions and thus no repetition is incorporated herein.

The main difference between the embodiment of FIG. 11 and the embodiment of FIG. 8 is that the arrangement of the active elements of the first driving unit DR1 in FIG. 8 is mirror symmetrical to the arrangement of the active elements of the second driving unit DR2, whereas the arrangement of the active elements of the first driving unit DR1 in FIG. 11 is substantially the same as the arrangement of the active elements of the second driving unit DR2.

Referring to FIG. 11, the plurality of the driving units include the first driving unit DR1 and the second driving unit DR2. The gate lines include the first to the eighth gate lines G1-G8 arranged in order, and the data lines include the first to the thirty-sixth data lines D1-D36 arranged in order. The output line 160 (shown in FIG. 9) of the first and the second driving units DR1, DR2 are electrically connected to the third and the fourth gate lines G3, G4 respectively. In other words, the first and the second driving units DR1 and DR2 respectively generate the driving signals of the third-stage and the fourth-stage (n=3, n=4) gate lines. The pre-stage input line 140 (shown in FIG. 9) of the first and the second driving units DR1 and DR2 are electrically connected to the first and the second gate lines G1, G2 respectively. The post-stage input line 150 (shown in FIG. 9) of the first and the second driving units DR1 and DR2 are electrically connected to the seventh and the eighth gate lines G7 and G8 respectively.

In the embodiment, each of the first driving unit DR1 and the second driving unit DR2 has the first to the seventh active elements M1-M7 and the capacitors C1 and C2 respectively, and arrangement of the first to the seventh active elements M1-M7 and the capacitors C1 and C2 of the first driving unit DR1 is similar to the arrangement of the first to the seventh active elements M1-M7 and the capacitors C1 and C2 of the second driving unit DR2. For example, in the first driving unit DR1, the active element M4 is on the right side of the active element M1 and the left side of the active element M7; in the second driving unit DR2, the active element M4 is also on the right side of the active element M1 and the left side of the active element M7. In the first driving unit DR1, the active element M7 is on the right side of the active element M4 and the left side of the active element M5; in the second driving unit DR2, the active element M7 is also on the right side of the active element M4 and the left side of the active element M5. In the first driving unit DR1, the active element M2 and/or the active element M3 are/is on the left side of the active element M6; in the second driving unit DR2, the active element M2 and/or the active element M3 are/is also on the left side of the active element M6.

In summary, according to some embodiments of the disclosure, the gate driver circuit is disposed in the pixel array. In this manner, the technical effect of reducing cost and significantly decreasing border area are achieved. According to some embodiments of the disclosure, the active elements that are electrically connected to the signal node Q and the signal node P are disposed at positions adjacent to each other such that the signal lines that are electrically connected to the signal node Q and the signal node P can be shorter and thus the display panel has a better quality.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A display panel, comprising:
  a display region and a non-display region, the non-display region located at a side of the display region;
  a plurality of gate lines, disposed in the display region;
  a plurality of data lines, disposed in the display region;
  a pixel array, disposed in the display region, and the pixel array has a plurality of pixel units, wherein each of the plurality of pixel units comprises three gate lines, two data lines and six sub-pixels, and each of the six sub-pixels is electrically connected to one of the plurality of gate lines and one of the plurality of data lines respectively; and
  a gate driver circuit, electrically connected to the plurality of the gate lines and disposed in the pixel array, wherein the gate driver circuit comprises a plurality of driving units, each of the plurality of driving units comprises a plurality of active elements and a plurality of signal lines, wherein one of the plurality of signal lines and the plurality of data lines are substantially parallel with each other, and the plurality of signal lines comprise a power signal line, a clock signal line, a pre-stage input line, a post-stage input line and an output line, wherein the pre-stage input line, the post-stage input line and the output line are respectively electrically connected to three of the plurality of gate lines in the display region, and at least one of the six sub-pixels is disposed between the clock signal line and the one of the plurality of data lines.

2. The display panel according to claim 1, wherein the plurality of driving units has a first driving unit, a second driving unit and a third driving unit, and each of the first driving unit, the second driving unit and the third driving unit comprises four active elements.

3. The display panel according to claim 2, wherein each of the first driving unit, the second driving unit and the third driving unit comprises:
  a first active element, having a control end, a first end and a second end, wherein the control end and the first end are connected to the pre-stage input line;
  a second active element, having a control end, a first end and a second end, wherein the control end is connected to the first active element, and the first end is electrically connected to the clock signal line, the second end is connected to the output line;
  a third active element, having a control end, a first end and a second end, wherein the first end is connected to the power signal line, the second end is electrically connected to the second end of the first active element, and the control end is connected to the post-stage input line; and
  a fourth active element, having a control end, a first end and a second end, wherein the control end is electrically connected to the post-stage input line, and the first end is electrically connected to the output line.

4. The display panel according to claim 3, wherein the plurality of gate lines comprise a (N−1)th gate line, a Nth gate line, a (N+1)th gate line, a (N+2)th gate line and a (N+3)th gate line, wherein N is an integer larger than 1, and in the first driving unit, the pre-stage input line is electrically connected to the (N−1)th gate line, the post-stage input line is electrically connected to the (N+1)th gate line, the output line is electrically connected to the Nth gate line; in the second driving unit, the pre-stage input line is electrically connected to the Nth gate line, the post-stage input line is electrically connected to the (N+2)th gate line, and the output line is electrically connected to the (N+1)th gate line; in the third driving unit, the pre-stage input line is electrically connected to the (N+1)th gate line, the post-stage input line is electrically connected to the (N+3)th gate line, and the output line is electrically connected to the (N+2)th gate line.

5. The display panel according to claim 4, wherein in each of the first driving unit, the second driving unit and the third driving unit, the first active element, the second active element, the third active element and the fourth active element are respectively disposed on the same horizontal line along an extending direction of the plurality of gate lines.

6. The display panel according to claim 5, wherein the four active elements in each of the first driving unit, the second driving unit and the third driving unit are arranged in a regular order on the horizontal line, and the order of arrangement is the third active element, the first active element, the second active element and the fourth active element.

7. The display panel according to claim 4, wherein the first active element, the second active element, the third active element and the fourth active element in each of the first driving unit and the second driving unit are disposed on the same horizontal line along an extending direction of the plurality of gate lines, and the fourth active element of the third driving unit is disposed on a different horizontal line relative to the first active element, the second active element and the third active element of the third driving unit.

8. The display panel according to claim 7, wherein the relationship of the arranged order along the extending direction of the plurality of gate lines between the four active elements in the first driving unit, the second driving unit and the third driving unit are different.

9. The display panel according to claim 7, wherein the first active element, the second active element and the third active element in the third driving unit are disposed between the (N+1)th gate line and the (N+2)th gate line, and the fourth active element in the third driving unit is disposed between the (N+2)th gate line and the (N+3)th gate line.

10. The display panel according to claim 1, wherein in one of the plurality of pixel units, the three gate lines have a first gate line, a second gate line and a third gate line, the two data lines have a first data line and a second data line, the six sub-pixels have a first sub-pixel, a second sub-pixel, a third sub-pixel, a fourth sub-pixel, a fifth sub-pixel and a sixth sub-pixel, wherein the first sub-pixel is electrically connected to the first gate line and the first data line respectively, the second sub-pixel is electrically connected to the first gate line and the second data line respectively, the third sub-pixel is electrically connected to the second gate line and a first data line of an another pixel unit adjacent to the one of the plurality of pixel units respectively, the fourth sub-pixel is electrically connected to the second gate line and the second data line respectively, the fifth sub-pixel is electorally connected to the third gate line and the second data line respectively, the sixth sub-pixel is electrically connected to the third gate line and the first data line of the another pixel unit respectively, and the first sub-pixel, the second sub-pixel and the third sub-pixel are disposed between the first gate line and the second gate line, and the fourth sub-pixel, the fifth sub-pixel and the sixth sub-pixel are disposed between the second gate line and the third gate line.

11. The display panel according to claim 10, wherein the one of the plurality of signal lines is disposed between the second sub-pixel and the third sub-pixel in the one of the plurality of pixel units.

12. The display panel according to claim 1, wherein in one of the plurality of pixel units, the three gate lines have a first gate line, a second gate line and a third gate line, the two data lines have a first data line and a second data line, the six sub-pixels have a first sub-pixel, a second sub-pixel, a third sub-pixel, a fourth sub-pixel, a fifth sub-pixel and a sixth sub-pixel, wherein the first sub-pixel is electrically connected to the first gate line and the second data line respectively, the second sub-pixel is electrically connected to the first gate line and the first data line of an another pixel unit adjacent to the one of the plurality of pixel units respectively, the third sub-pixel is electrically connected to the second gate line and the second data line respectively, the fourth sub-pixel is electrically connected to the second gate line and the first data line respectively, the fifth sub-pixel is electrically connected to the third gate line and the second data line respectively, the sixth sub-pixel is electrically connected to the third gate line and the first data line of the another pixel unit respectively, the first sub-pixel, the second sub-pixel and the third sub-pixel are disposed between the first gate line and the second gate line, and the fourth sub-pixel, the fifth sub-pixel and the sixth sub-pixel are disposed between the second gate line and the third gate line.

13. The display panel according to claim 12, wherein the one of the plurality of signal lines is disposed between the second sub-pixel and the third sub-pixel in the one of the plurality of pixel units.

14. The display panel according to claim 1, wherein in one of the plurality of pixel units, the three gate lines have a first gate line, a second gate line and a third gate line, the two data lines have a first data line and a second data line, the six sub-pixels have a first sub-pixel, a second sub-pixel, a third sub-pixel, a fourth sub-pixel, a fifth sub-pixel and a sixth sub-pixel, wherein the first sub-pixel is electrically connected to the first gate line and the second data line respectively, the second sub-pixel is electrically connected to the second gate line and the second data line respectively, the third sub-pixel is electrically connected to the first gate line and the first data line of an another pixel unit adjacent to the one of the plurality of pixel units respectively, the fourth sub-pixel is electrically connected to the second gate line and the first data line respectively, the fifth sub-pixel is electrically connected to the third gate line and the second data line respectively, the sixth sub-pixel is electrically connected to the third gate line and the first data line of the another pixel unit, and the first sub-pixel, the second sub-pixel and the third sub-pixel are disposed between the first gate line and the second gate line, and the fourth sub-pixel, the fifth sub-pixel and the sixth sub-pixel are disposed between the second gate line and the third gate line.

15. The display panel according to claim 14, wherein one of the plurality of signal lines is disposed between the second sub-pixel and the third sub-pixel in the one of the plurality of pixel units.

16. A display panel, comprising:
a display region and a non-display region, the non-display region located at a side of the display region;

a plurality of gate lines, disposed in the display region;

a plurality of data lines, disposed in the display region;

a pixel array, disposed in the display region, and the pixel array has a plurality of pixel units, wherein each of the plurality of pixel units comprises three gate lines, two data lines and six sub-pixels, and each of the six sub-pixels is electrically connected to one of the plurality of gate lines and one of the plurality of data lines respectively; and a gate driver circuit, electrically connected to the plurality of the gate lines and disposed in the pixel array, wherein the gate driver circuit comprises a plurality of driving units, each of the plurality of driving units comprises a plurality of active elements and a plurality of signal lines, wherein one of the plurality of signal lines and the plurality of data lines are substantially parallel with each other, and each of the plurality of driving units comprises seven active elements, wherein the plurality of signal lines have a power signal line, a first clock signal line, a second clock signal line, a pre-stage input line, a post-stage input line and an output line.

17. The display panel according to claim 16, wherein each of the plurality of driving units respectively comprises:

a first active element, having a control end, a first end and a second end, wherein the control end is electrically connected to the post-stage input line, the first end is electrically connected to the power signal line;

a second active element, having a control end, a first end and a second end, wherein the first end is electrically connected to the power signal line, the control end is electrically connected to the second end of the first active element;

a third active element, having a control end, a first end and a second end, wherein the control end is electrically connected to the second end of the second active element, the first end is electrically connected to the power signal line;

a fourth active element, having a control end, a first end and a second end, wherein the control end and the first end are electrically connected to the pre-stage input line, the second end is electrically connected to the second end of the first active element;

a fifth active element, having a control end, a first end and a second end, wherein the control end is electrically connected to the second clock signal line, the first end is electrically connected to the output line, and the second end is electrically connected to the power signal line;

a sixth active element, having a control end, a first end and a second end, wherein the control end is electrically connected to the second end of the second active element, the first end is electrically connected to the power signal line, and the second end is electrically connected to the output line;

a seventh active element, having a control end, a first end and a second end, wherein the control end is electrically connected to the second end of the fourth active element, the first end is electrically connected to the output line, and the second end is electrically connected to the first clock signal line.

18. The display panel according to claim 17, wherein in each of the plurality of the driving units, the first active element, the fourth active element, the fifth active element and the seventh active element are disposed on the same horizontal line along an extending direction of the plurality of gate lines, and the second active element, the third active element and the sixth active element are disposed on another horizontal line along the extending direction of the plurality of gate lines.

* * * * *